United States Patent [19]

Snyder et al.

[11] 4,343,589
[45] Aug. 10, 1982

[54] LINEAR LOADER FOR HIGH SPEED RADIAL LEAD COMPONENT SEQUENCING AND INSERTING MACHINE

[75] Inventors: Michael D. Snyder, Binghamton, N.Y.; Crawford A. Matson, Wyalusing, Pa.

[73] Assignee: Universal Instruments Corporation, Binghamton, N.Y.

[21] Appl. No.: 142,136

[22] Filed: Apr. 18, 1980

[51] Int. Cl.³ .............................................. B65G 25/04
[52] U.S. Cl. ............................. 414/751; 294/87 SH; 414/225
[58] Field of Search ............................ 414/749–751, 414/729, 618, 225; 294/87 R, 87 SH, DIG. 2; 198/484, 479, 486

[56] References Cited
U.S. PATENT DOCUMENTS

| | | | |
|---|---|---|---|
| 2,911,114 | 11/1959 | Gartner | 414/618 |
| 3,300,020 | 1/1967 | Seaman | 198/484 X |
| 3,802,547 | 4/1974 | Wagers, Jr. | 198/484 |
| 4,069,931 | 1/1978 | Saylors | 414/749 X |
| 4,111,311 | 9/1978 | Hirama | 414/749 |
| 4,173,427 | 11/1979 | Beuch | 414/751 |

*Primary Examiner*—Trygve M. Blix
*Assistant Examiner*—Terrance L. Siemens
*Attorney, Agent, or Firm*—Fidelman, Wolffe & Waldron

[57] ABSTRACT

Under direction of a machine controller, an endless chain conveyor is incrementally passed by a plurality of loader heads. The loader heads receive a series of components taped on a reel supplied substrate, sever individual taped components from the supply, and load the individual taped components onto clip carriers of the endless conveyor, on command, in a preferred sequence. The clip carrier mounted components are then indexed past a cutter assembly for trimming the lengths of the leads and removing the substrate, and a positioning disc assembly for positioning the components in the clip carriers before being passed to a rotary transfer assembly. The rotary transfer assembly removes individual components from the conveyor and rotates to an unload position above a linear loader, which laterally transfers the components from the rotary transfer to an insert head assembly. At the insert head assembly, the components are oriented and inserted by their leads into the holes of a printed circuit board for clinching by a clinch mechanism. Any components still left on the conveyor after it passes the rotary transfer assembly are removed by a chain unloader.

6 Claims, 47 Drawing Figures

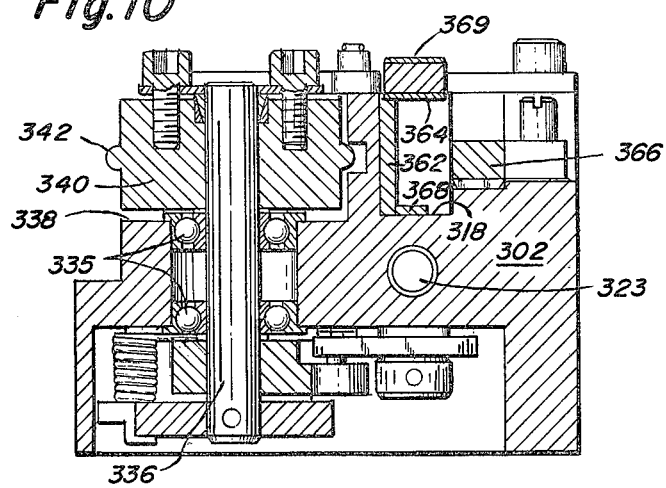
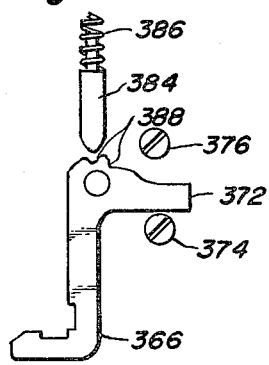
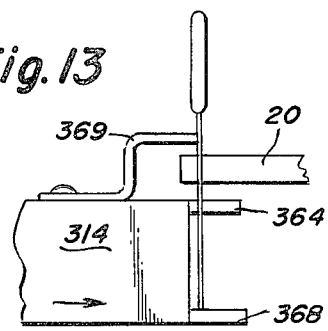
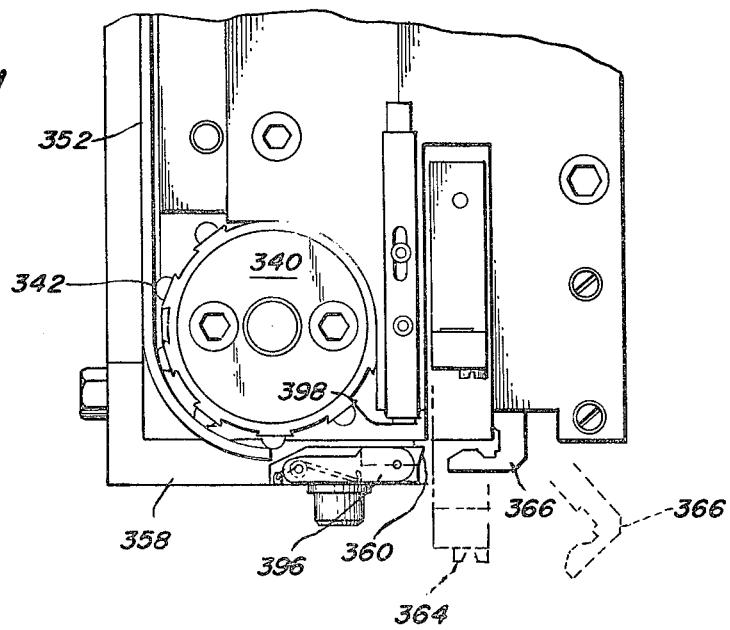

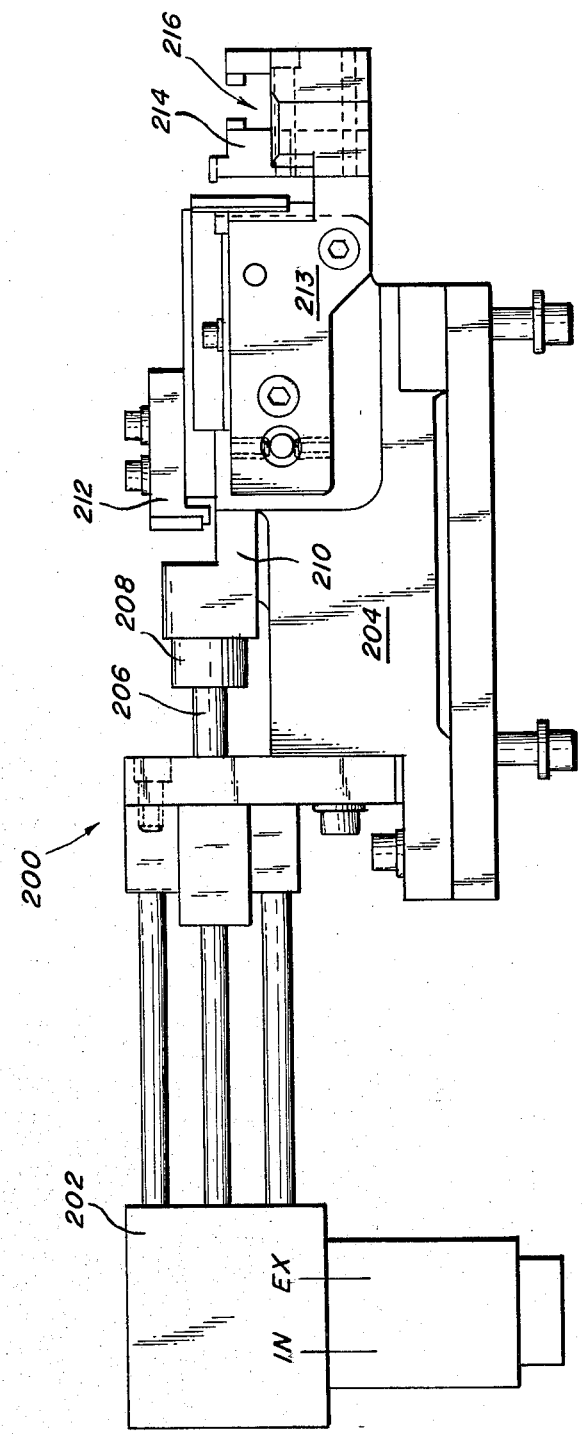

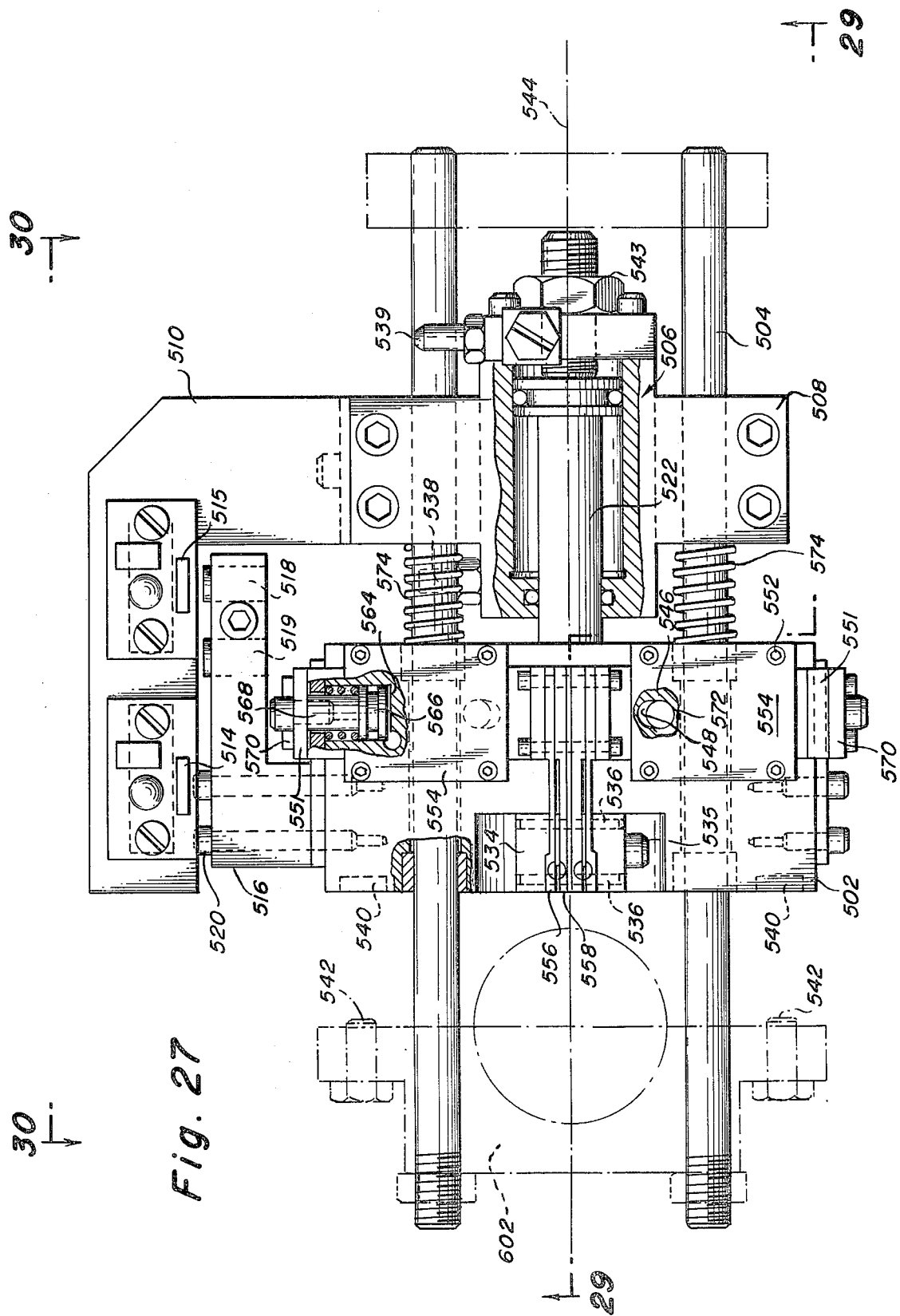

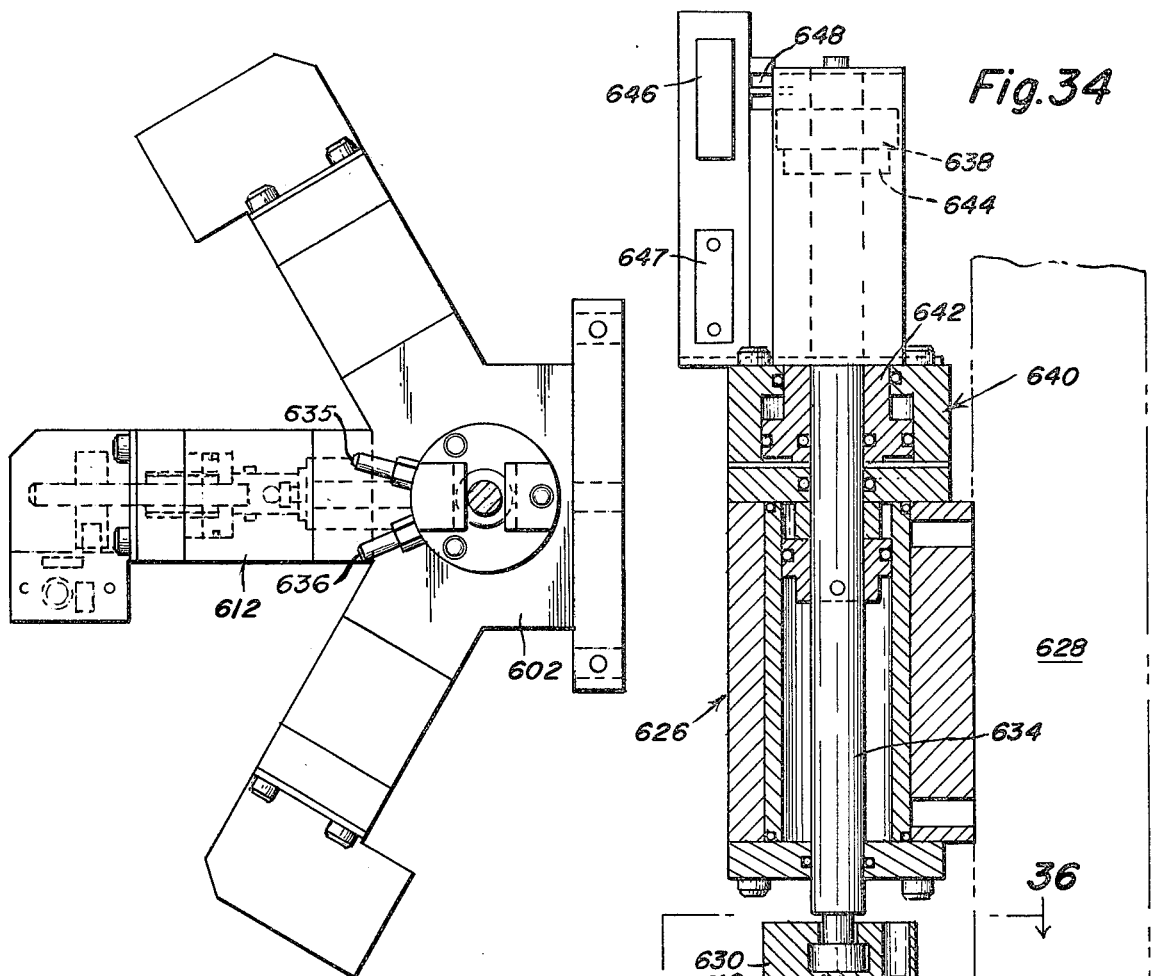
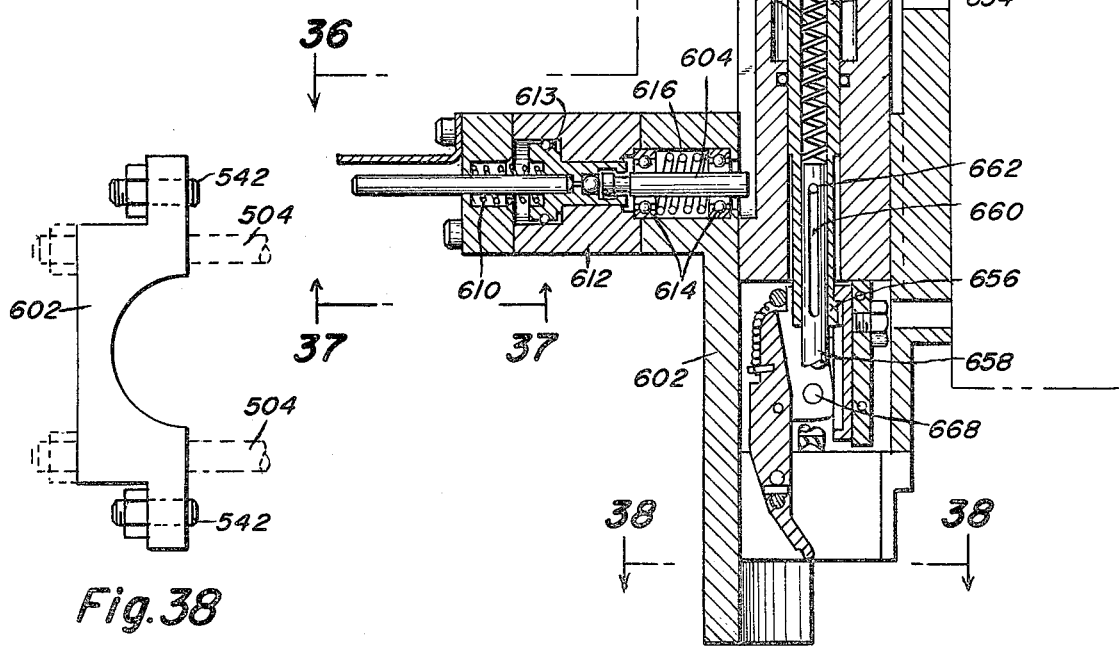
Fig. 34
Fig. 36
Fig. 38

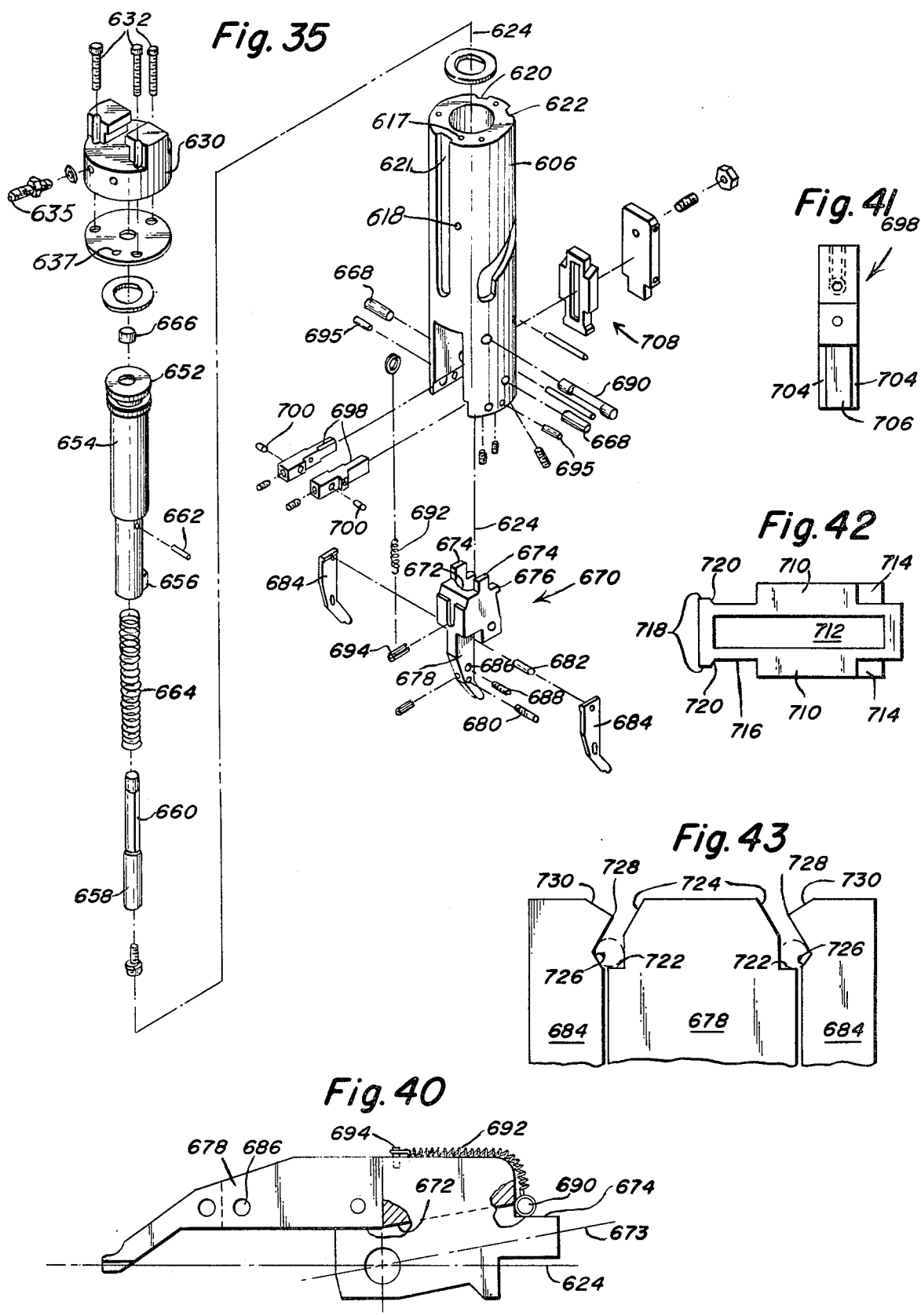

LINEAR LOADER FOR HIGH SPEED RADIAL LEAD COMPONENT SEQUENCING AND INSERTING MACHINE

PRIOR ART

Examples in the prior art of electronic component handling machines pertinent to the instant invention are found in U.S. Pat. Nos. 2,896,213; 3,254,821; 3,383,022; 3,455,493; and 3,777,350; as well as U.S. Pat. No. 4,203,583—"Radial Lead Component Insertion Machine"—Zemek, et al., filed May 19, 1978.

BACKGROUND OF THE INVENTION

This invention relates to a method and apparatus for selective high speed sequencing of radial lead components onto an endless conveyor, transfer of the components to an insertion head, and insertion of the components into the holes of a printed circuit board.

In the past, different methods and types of apparatus have been devised for sequencing, transferring, and inserting components of the above described type. These prior methods and apparatus, however, handle the components by their bodies or by at least two leads. When components were handled by more than one lead, adjustments (requiring "down-time") needed to be made in the equipment to handle different center-to-center lead spans.

Further, prior art devices of this nature used shuttles to pick up a component from one of a plurality of supply stations and transfer it to an insertion assembly. According to the distances between the supply stations and the insertion assembly the shuttle would have to travel variable distances and therefor require variable travel times. Because of this, prior art devices were also limited in the amount of supply stations that could reasonably be added to the machine.

Accordingly, it is an object of the present invention to provide an improved method and apparatus for handling radial lead components of different center-to-center lead spans, in which several functions are performed in parallel, thus providing time sharing handling of the components.

It is another object of the present invention to provide transfer apparatus for a sequencing and insertion machine in which all of the transfer means are incrementally moved a fixed amount, with time sharing, thereby reducing transfer time.

It is a further object of this invention to provide an expansible sequencing transfer means having a fixed incremental movement of transfer.

Other objects of the invention will, in part, be obvious and will, in part, appear hereinafter.

The above outlined objectives are accomplished by means of sequencing, transfer, and insertion apparatus which, according to the present invention, generally includes an endless chain conveyor for clamping and carrying radial lead components by one lead only, and a plurality of supply stations for loading the components onto the conveyor chain in a preferred sequence during incremental movement of the chain. In timed relation to the incremental movement of the chain, a Rotary Transfer Assembly unloads the sequenced components, rotates and transfers the components to a Linear Loader, which unloads the Rotary Transfer Assembly and loads an Insert Assembly for insertion of the components into a printed circuit board in a preferred orientation.

Also, in the disclosed embodiment, the length of the endless conveyor chain may be increased and the number of Sequencer Loading Heads may be increased to provide a larger number of different types of components for sequencing and transfer.

Although more transfer stations are incorporated into the present invention than are used in the prior art, these various transfer mechanisms are used on a time sharing arrangement to provide faster population of a printed circuit board by the insertion apparatus.

Also, by eliminating the need for the insertion head to rotate to pick up a component, the population of the printed circuit board is much faster.

For further understanding of the nature and objects of the invention, reference should be had to the following detailed description taken in connection with the accompanying drawings, in which.

Figure 4A:
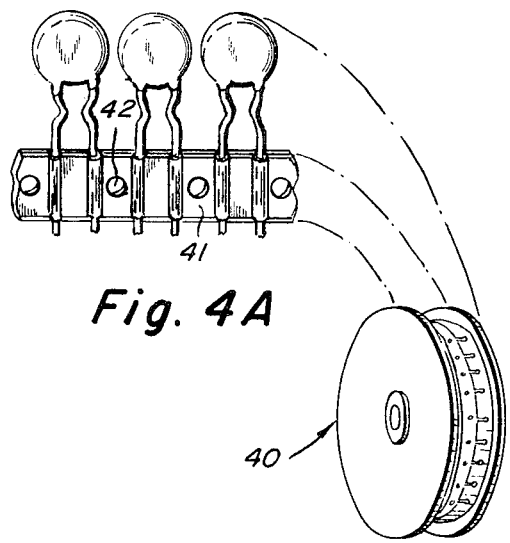
FIG. 4a is a schematic representation of reel supplied, substrate mounted components of the radial lead type.
Figure 4B:
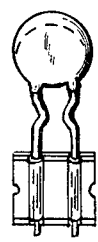

FIG. 4b discloses a substrate mounted component that has been severed from the rest of the supply.

Figure 5:
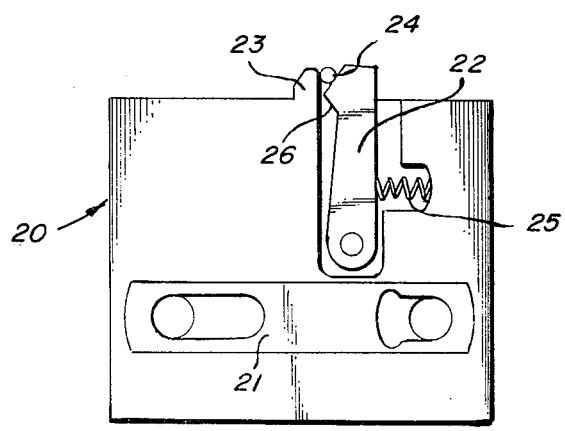

FIG. 5 is a top plan view, partially in section, of the clip carrier of the endless chain conveyor.

Figure 6:
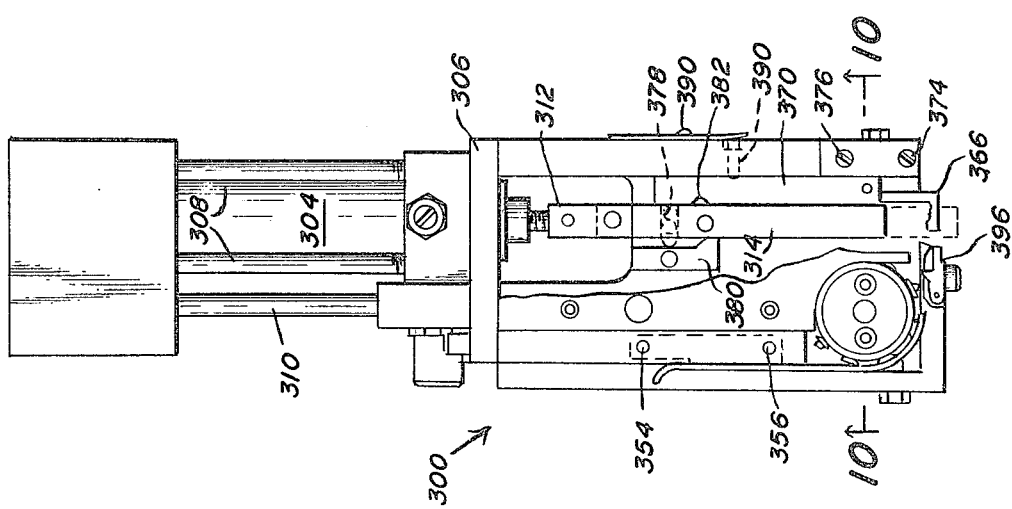

FIG. 6 is a top plan view, partially in section, of the sequencer loading head.

Figure 7:
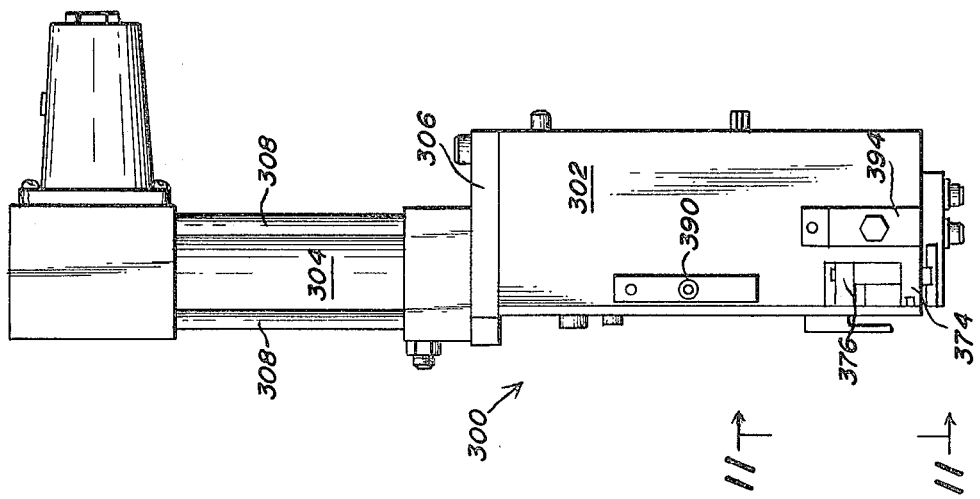

FIG. 7 is a right side elevational view of FIG. 6.

Figure 8:
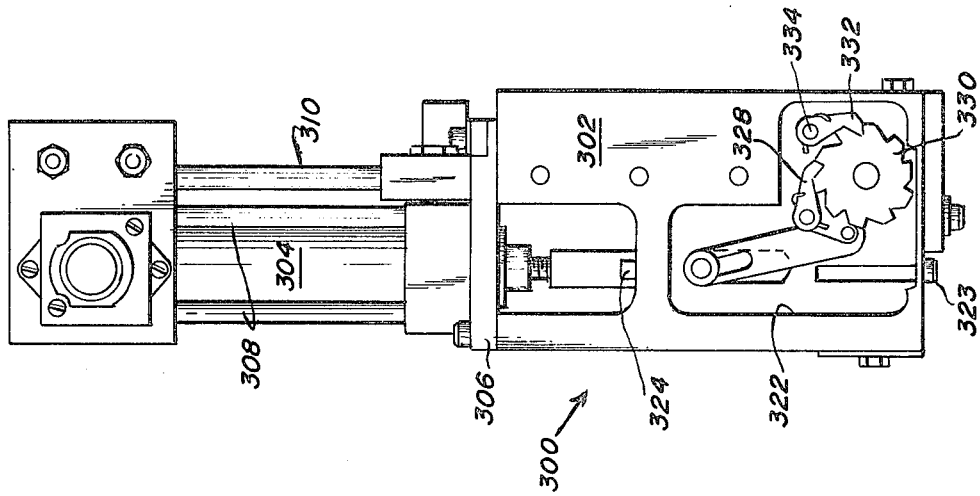

FIG. 8 is a bottom plan view of the apparatus of FIG. 6.

Figure 9:
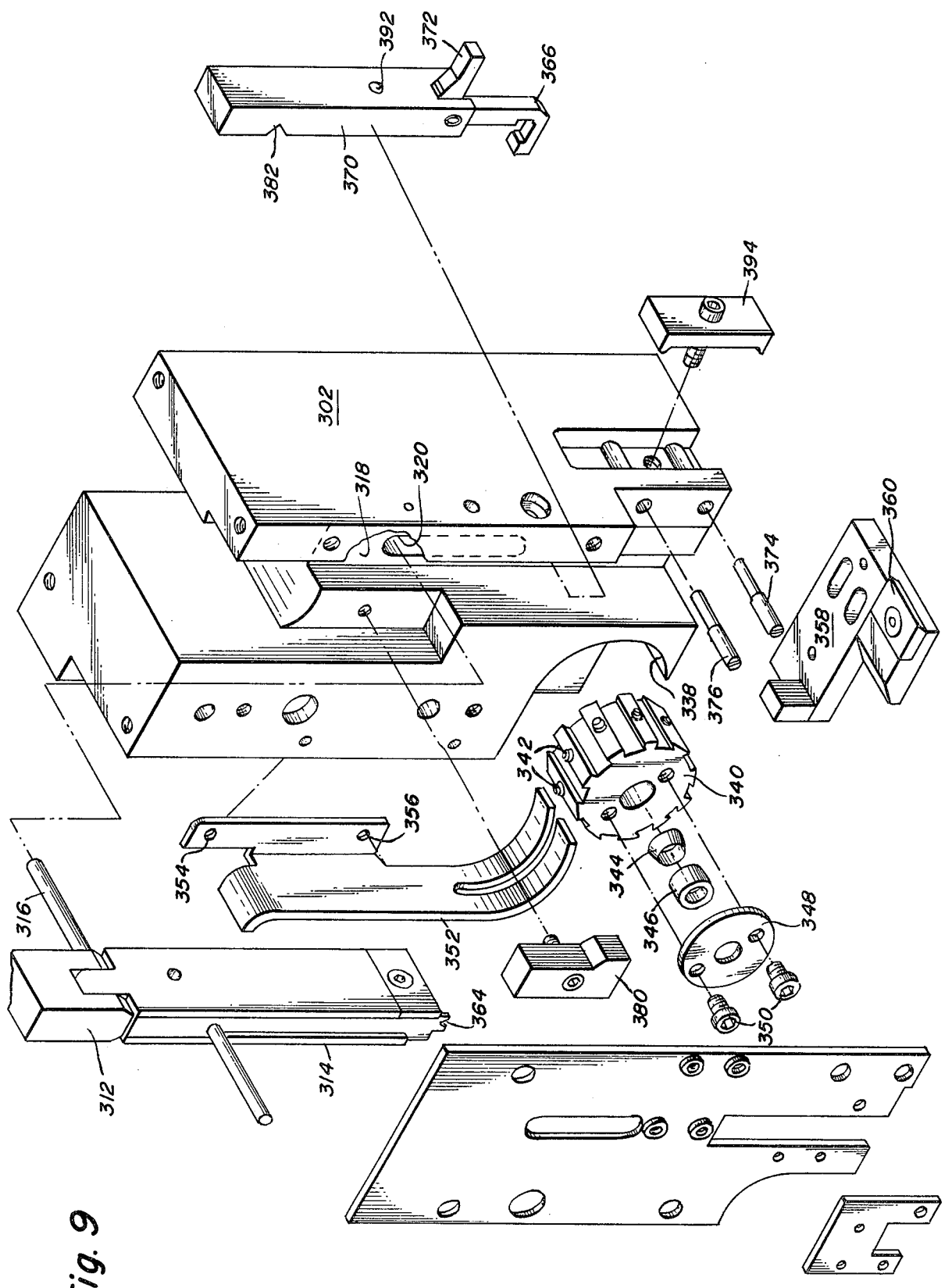

FIG. 9 is an exploded isometric view of part of the mechanism of FIG. 6.

FIG. 10 is a sectional view of FIG. 6 along the lines 10—10.

FIG. 11 is a top plan view of the apparatus of FIG. 7 taken along the lines 11—11.

FIG. 12 is a partial schematic of the pivotal retainer arm and actuation means therefor.

FIG. 13 is a partial schematic view of a component being loaded into the clip carrier.

FIG. 14 is a left side elevation of the cutter assembly.

Figure 15:
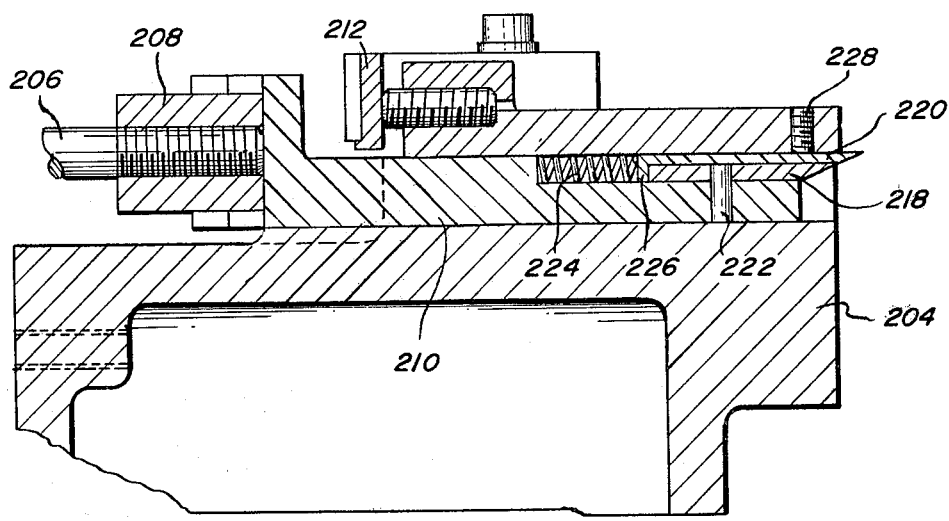

FIG. 15 is a left side partial section of the apparatus of FIG. 14.

Figure 16A:
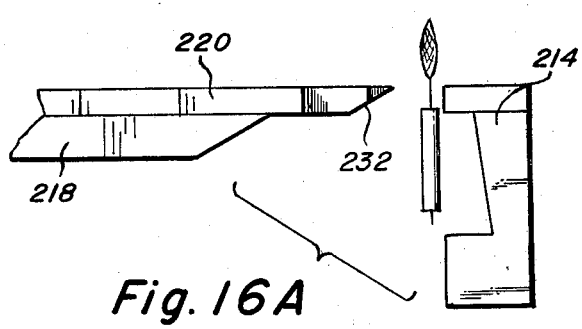
Figure 16B:
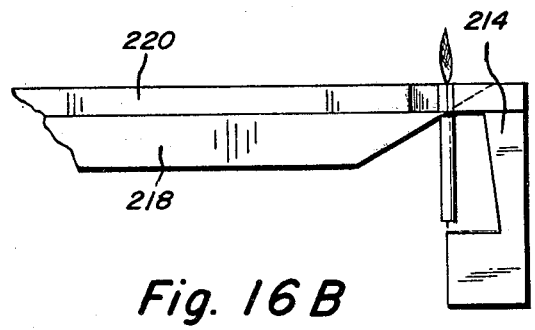
Figure 17:
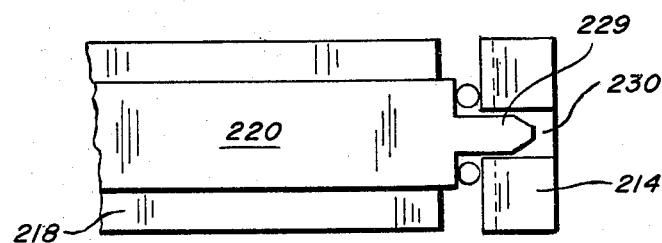

FIGS. 16a, 16b, and 17 are partial schematics disclosing the cutting operation.

Figure 18:
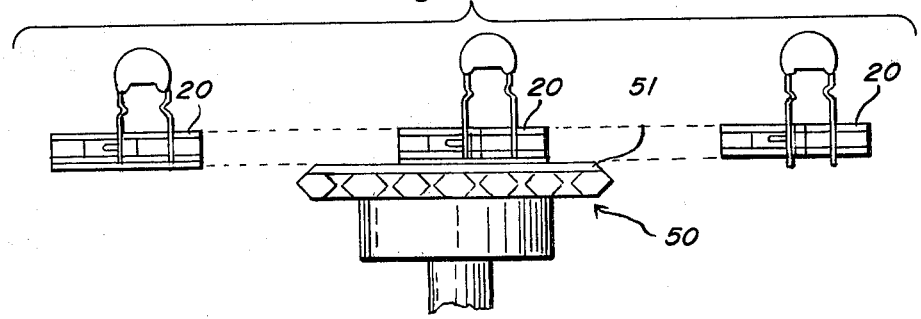

FIG. 18 is a partial schematic of the lead translation disc.

Figure 19:
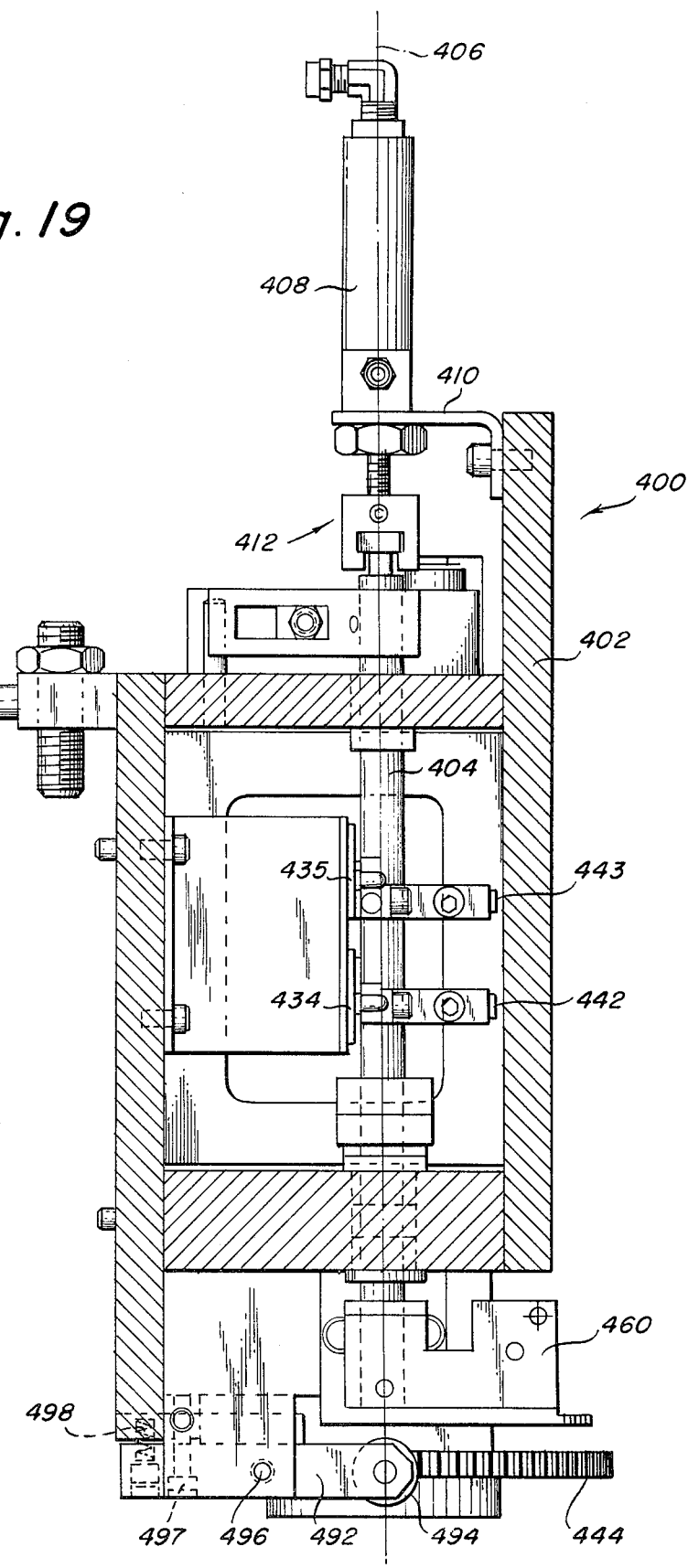

FIG. 19 is a left side elevation of the rotary transfer mechanism.

Figure 20:
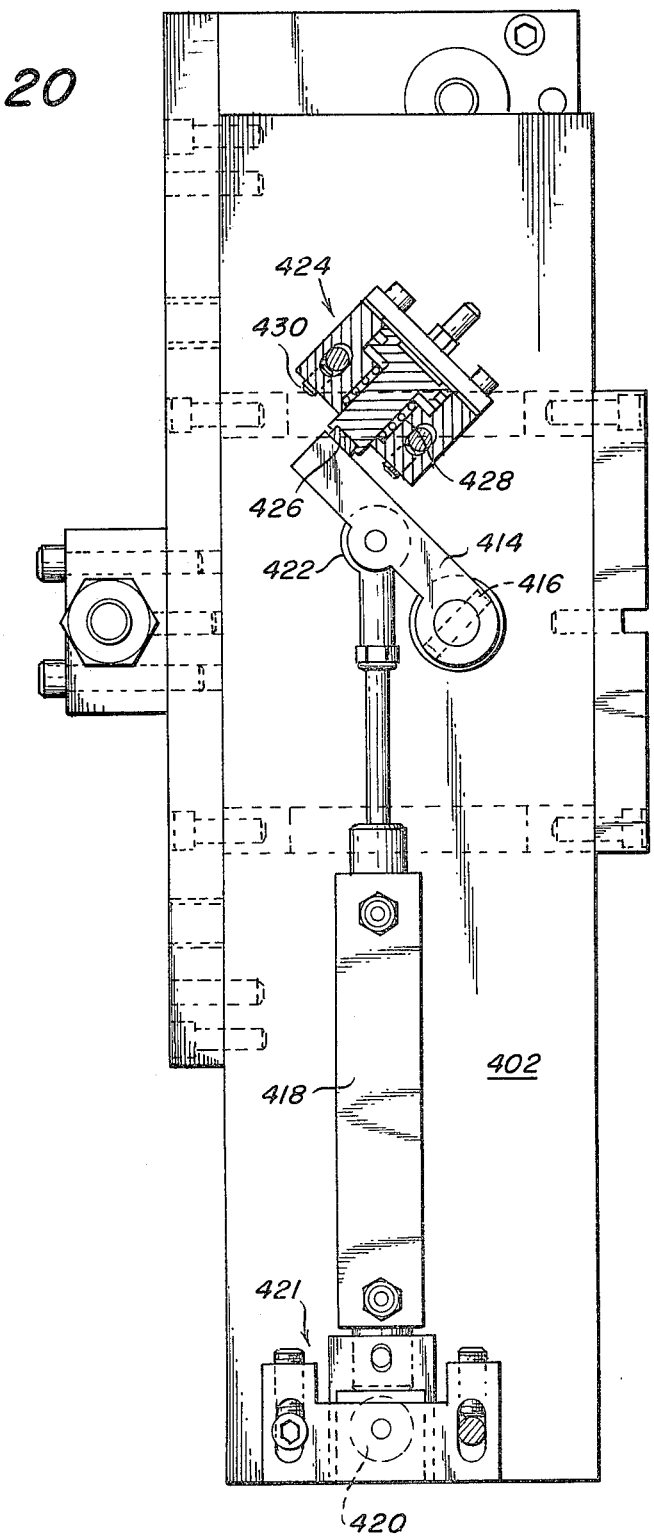

FIG. 20 is a top plan view of the rotary transfer mechanism of FIG. 19.

Figure 21:
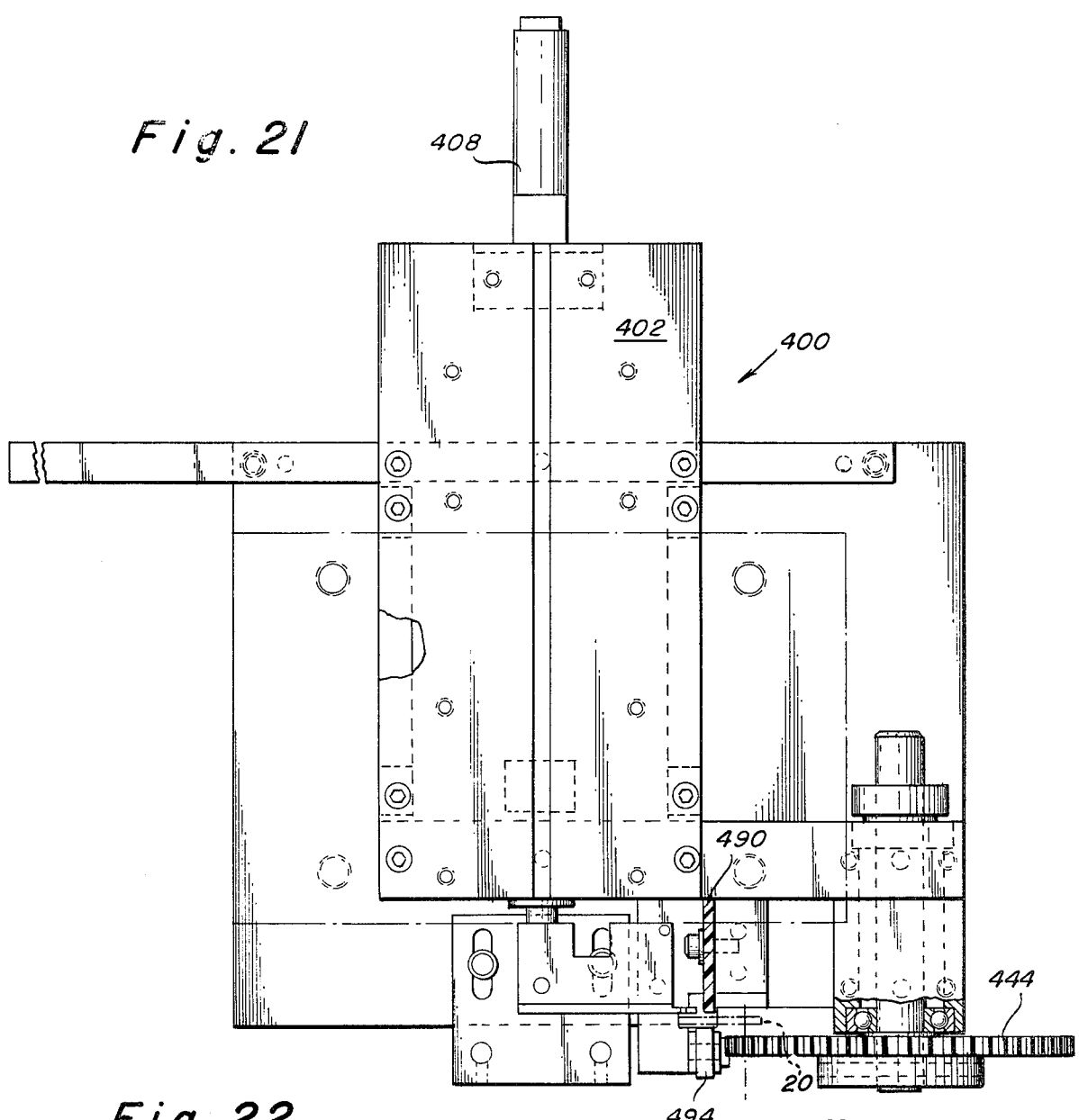

FIG. 21 is a front elevation of the apparatus of FIG. 19.

Figure 22:
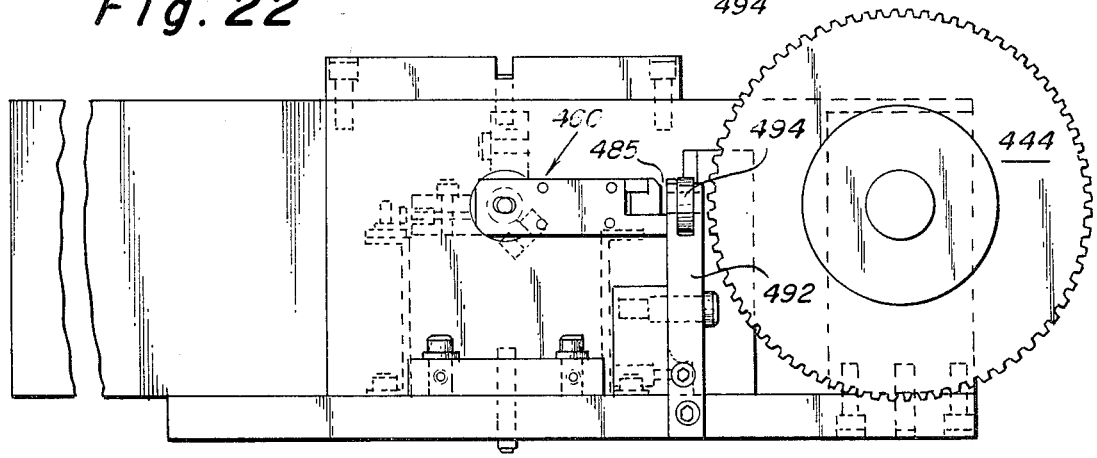

FIG. 22 is a bottom plan view of the apparatus of FIG. 21.

Figure 23:
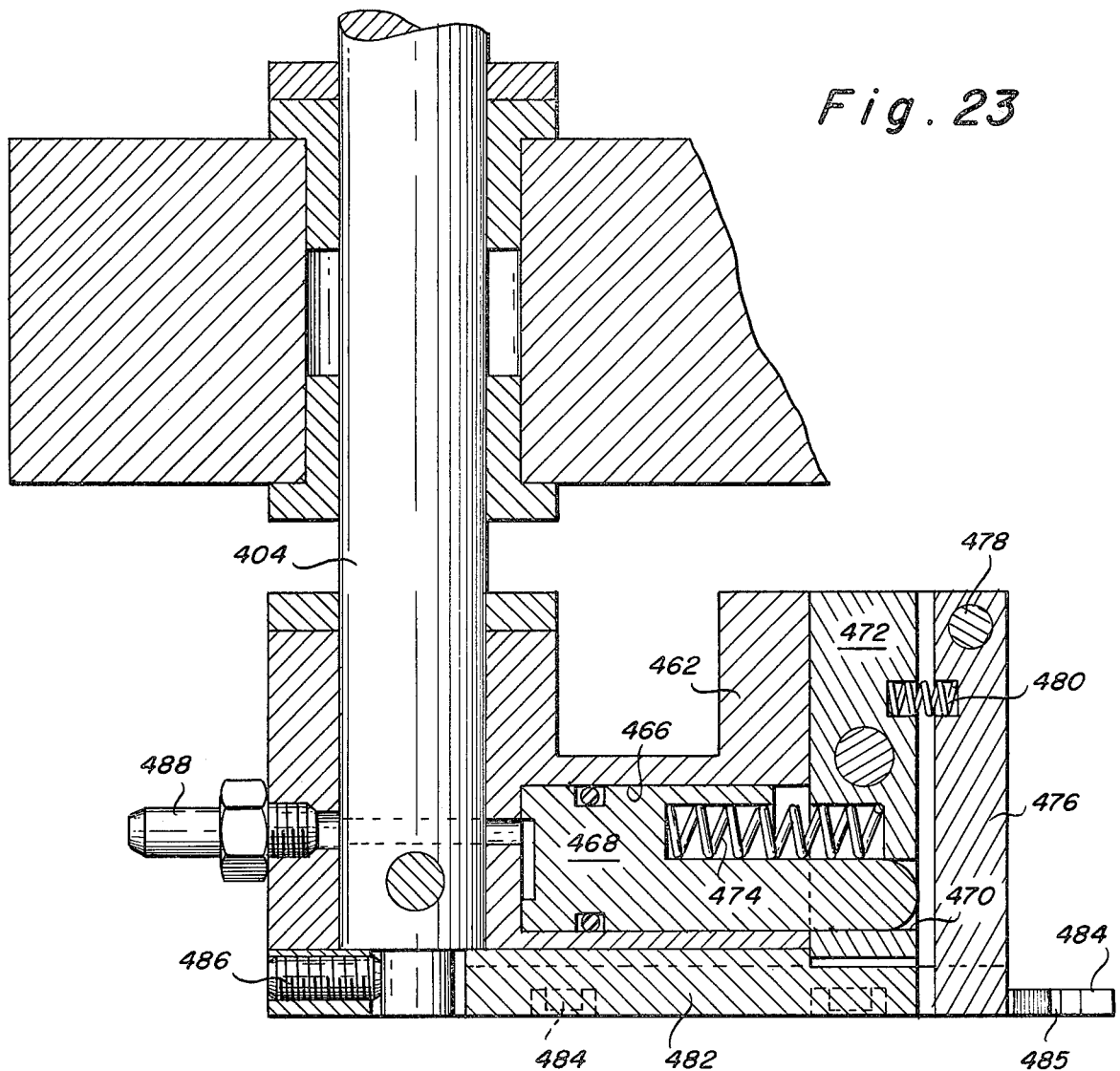

FIG. 23 is an enlarged view of the rotary transfer head of FIG. 19 partially in section.

Figure 24:
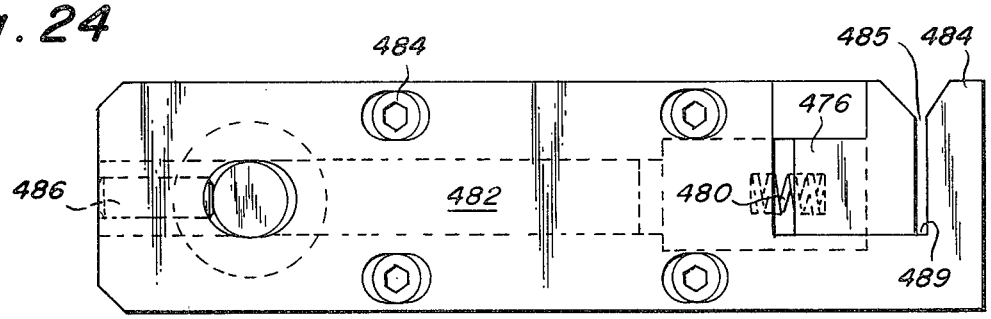

FIG. 24 is a bottom plan view of the rotary transfer head of FIG. 23.

Figure 25:
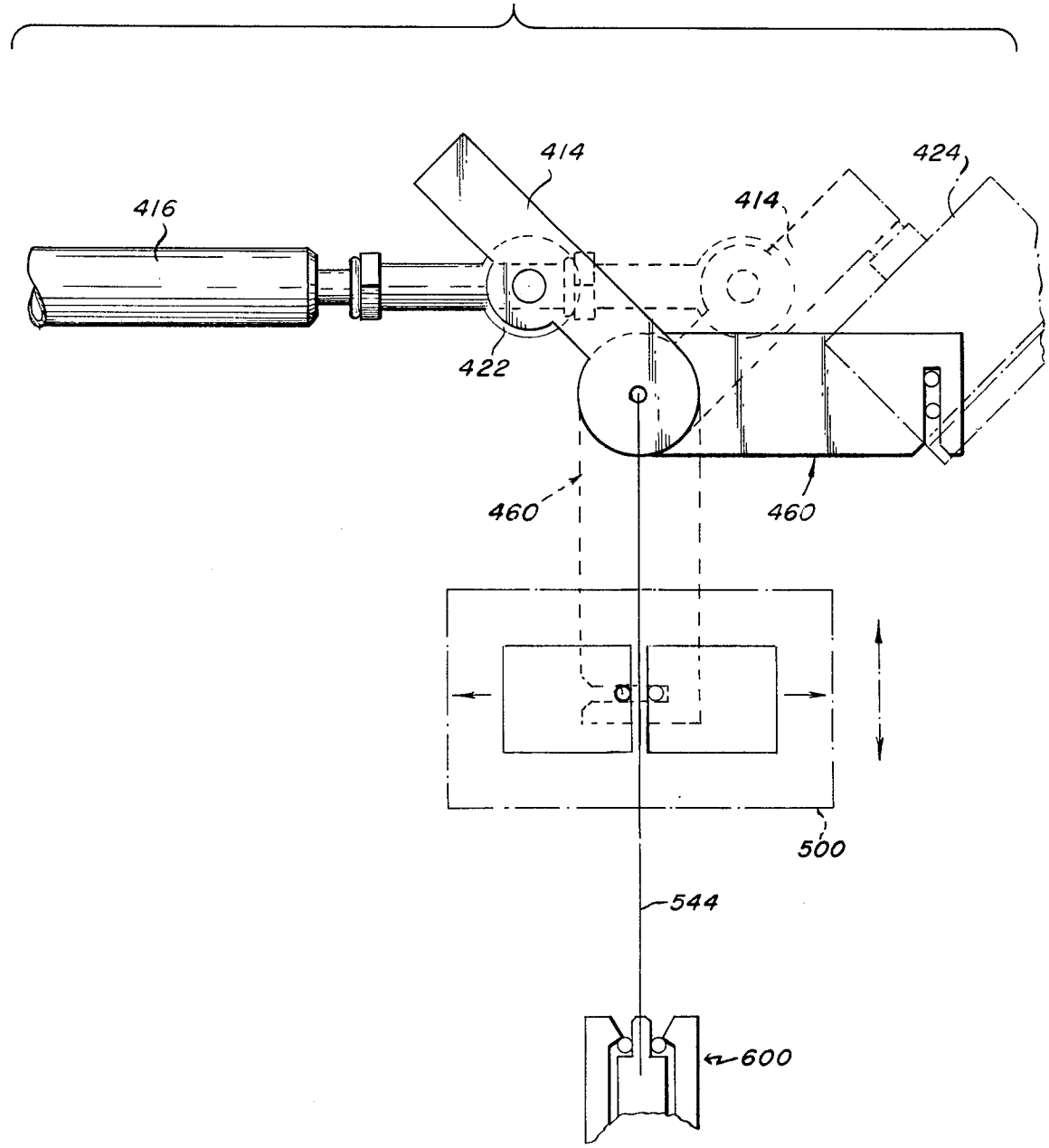

FIG. 25 is a partial schematic view of the rotary transfer head, linear loader, and insert head jaws.

Figure 26:
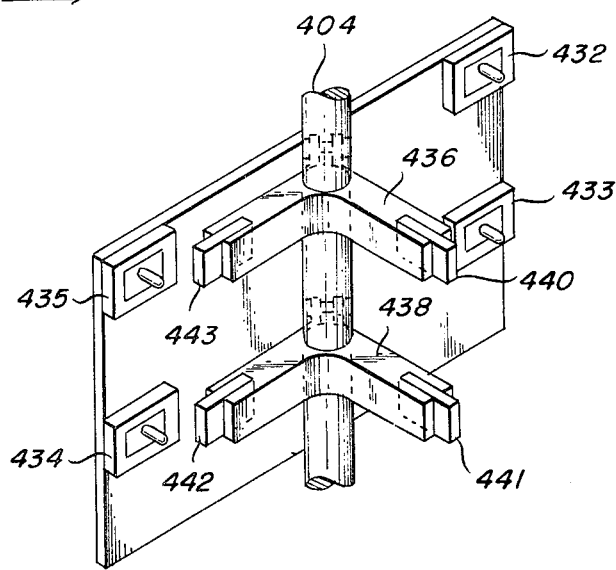

FIG. 26 discloses the details of the sensing mechanism of FIG. 19.

FIG. 27 is a top plan view of the linear loader assembly, partially in section.

Figure 28:
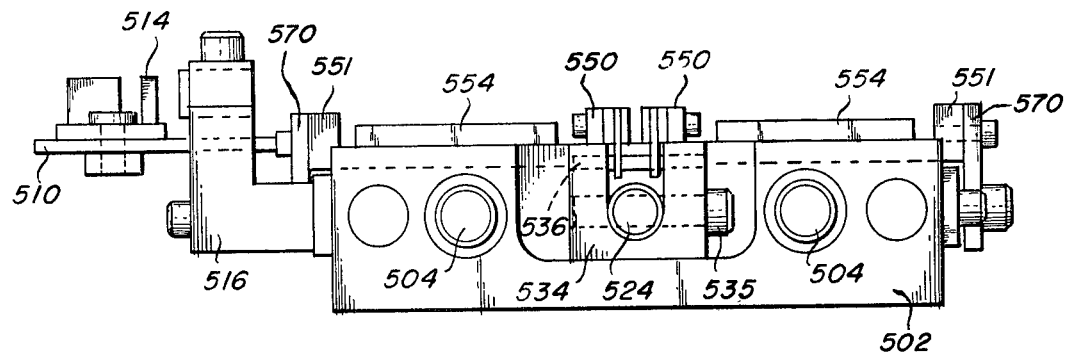

FIG. 28 is a left side elevation of the apparatus of FIG. 27.

Figure 29:
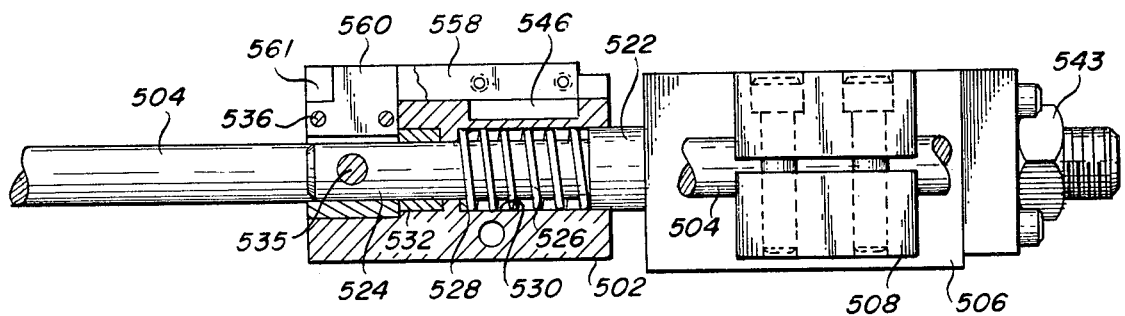

FIG. 29 is a partial front sectional view of the apparatus of FIG. 27.

Figure 30:
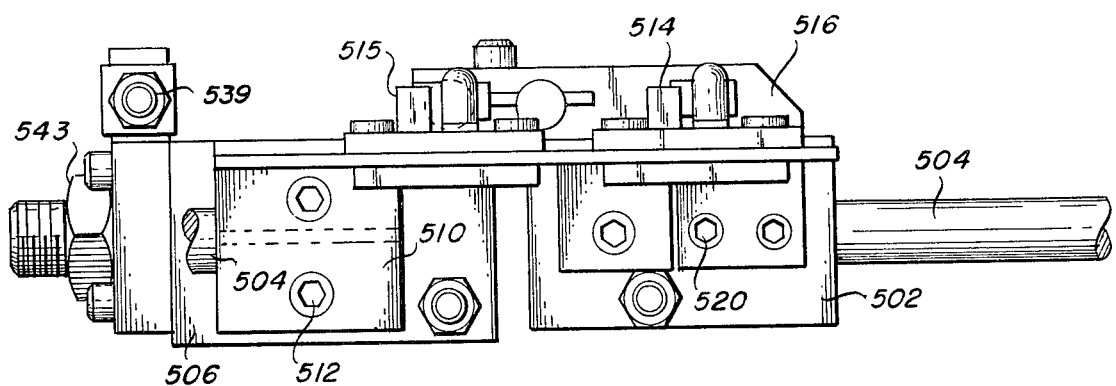

FIG. 30 is an elevational view taken along arrows 30—30 of FIG. 27.

Figure 31:
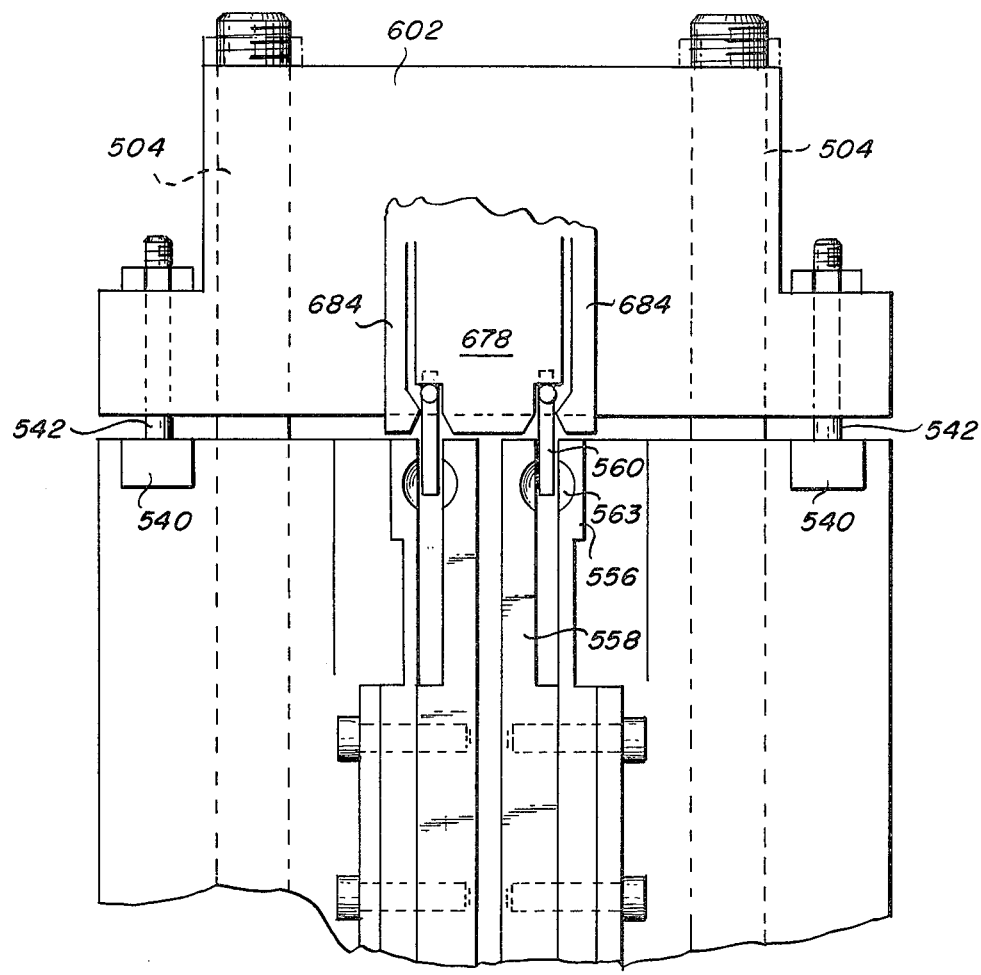

FIG. 31 is a partial schematic view of the linear loader during loading of the insert head assembly.

Figure 32:
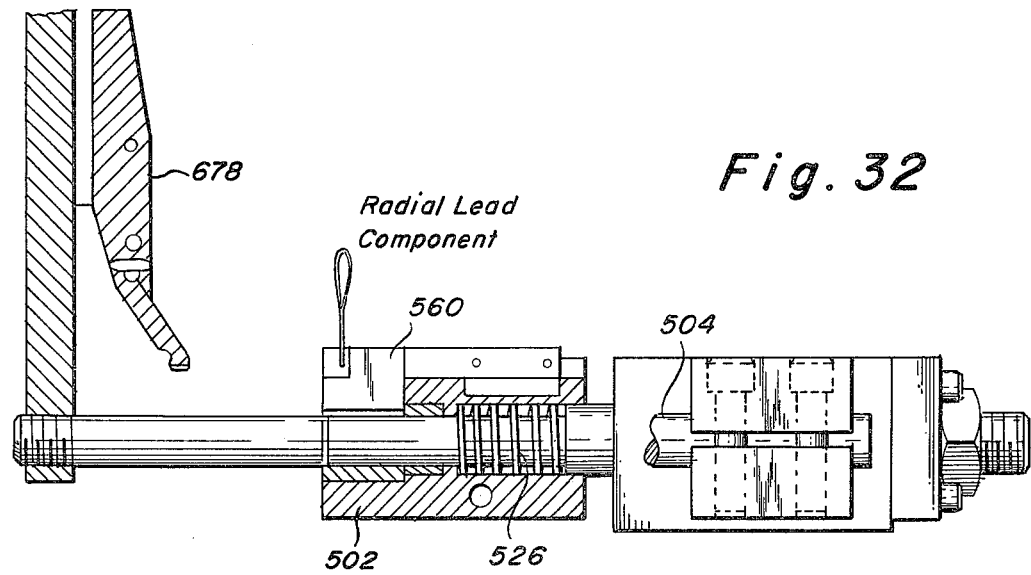

FIG. 32 is a partial schematic of the linear loader in the receive position and in preparation to load the insert head assembly.

Figure 33:
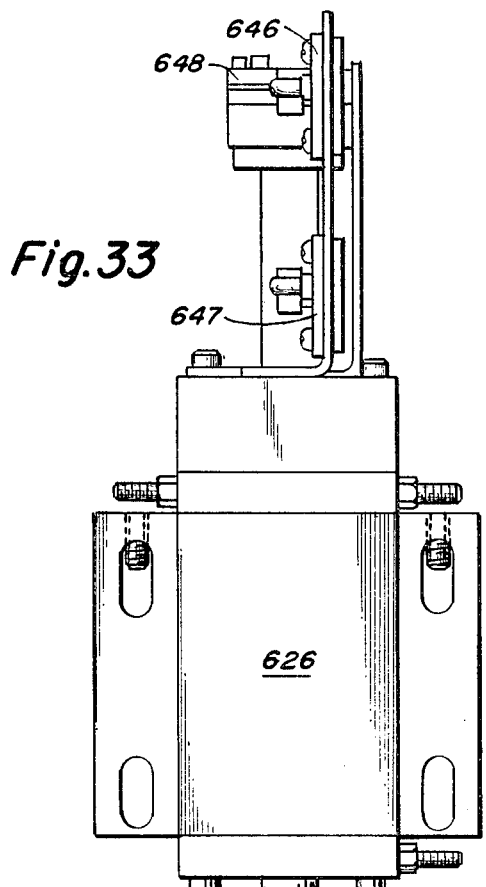

FIG. 33 is a front elevation of the insert head assembly.

FIG. 34 is a right side sectional view of the apparatus of FIG. 33.

FIG. 35 is an exploded isometric partial view of the apparatus of FIG. 34.

FIG. 36 is a top plan view taken along arrows 36—36 of FIG. 34.

Figure 37:
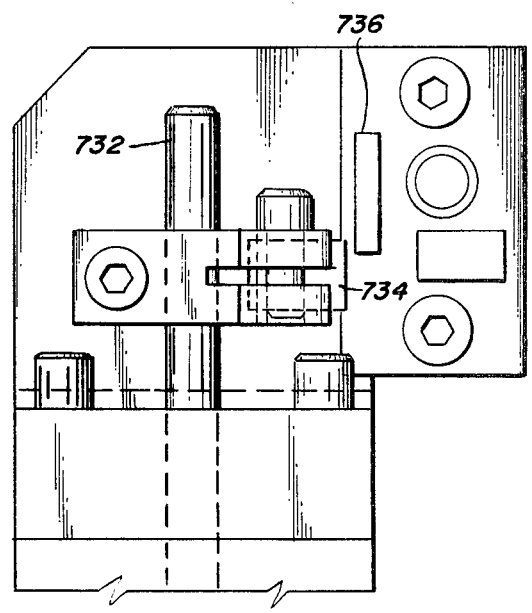

FIG. 37 is a bottom plan view of the apparatus of FIG. 34 taken along arrows 37—37.

FIG. 38 is a sectional view along arrows 38—38 of FIG. 34.

Figure 39:
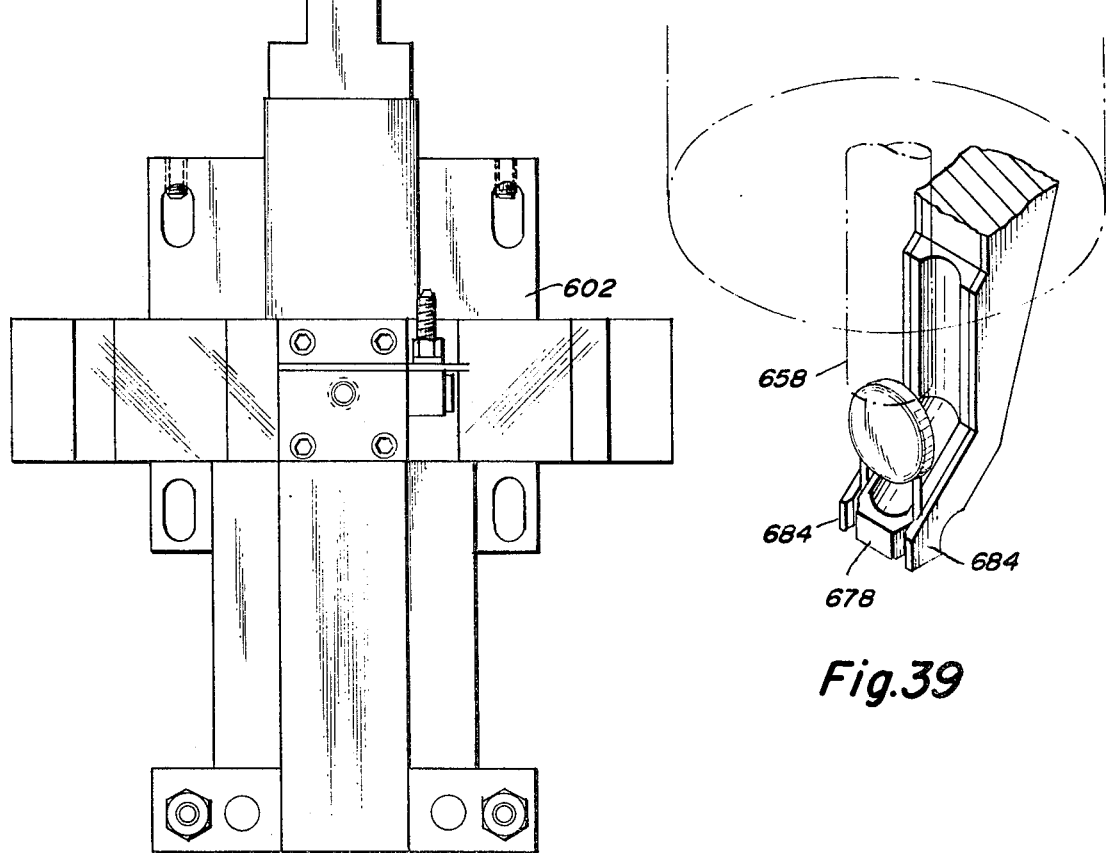

FIG. 39 is a partial schematic of the insert jaws of the insert head apparatus with a component held therein.

FIG. 40 is a side elevation, partially in section, of the guide jaw of the insert head assembly.

FIG. 41 is a detailed view of the clamping bars of the insert head assembly.

FIG. 42 is a detailed view of the cam plate of the insert head assembly.

FIG. 43 is a detailed view, partially in section, of the clamping jaws of the insert head assembly.

Figure 44:
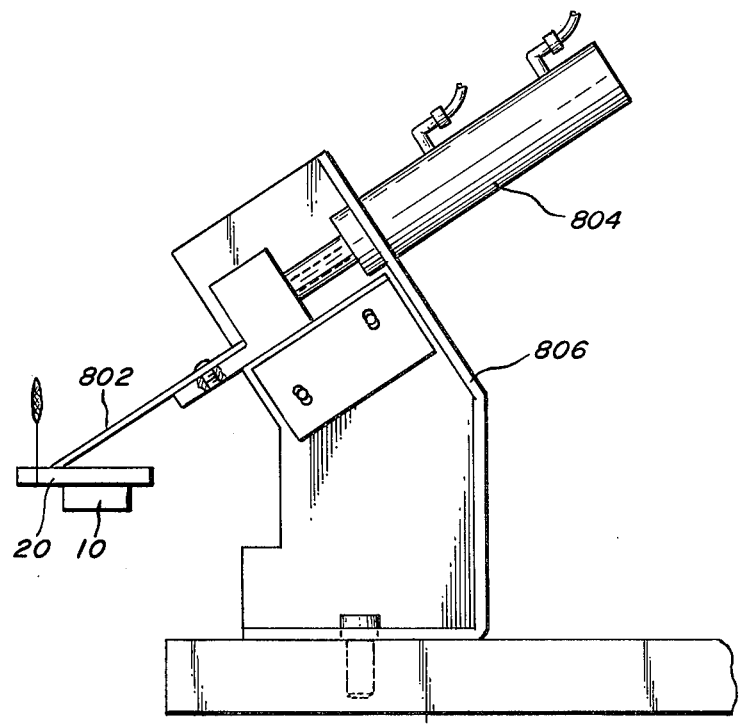

FIG. 44 is a left side elevational view of the chain unloader assembly.

Figure 45:
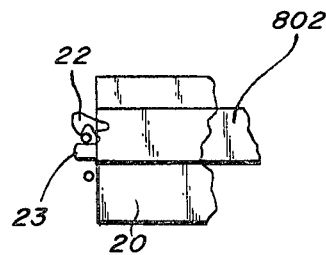

FIG. 45 is a partial schematic of the chain unloader assembly while unloading a component from a clip carrier.

DETAILED DESCRIPTION

One embodiment of the invention will now be described with reference to the drawings, similar reference characters of which refer to similar parts.

Figure 1:
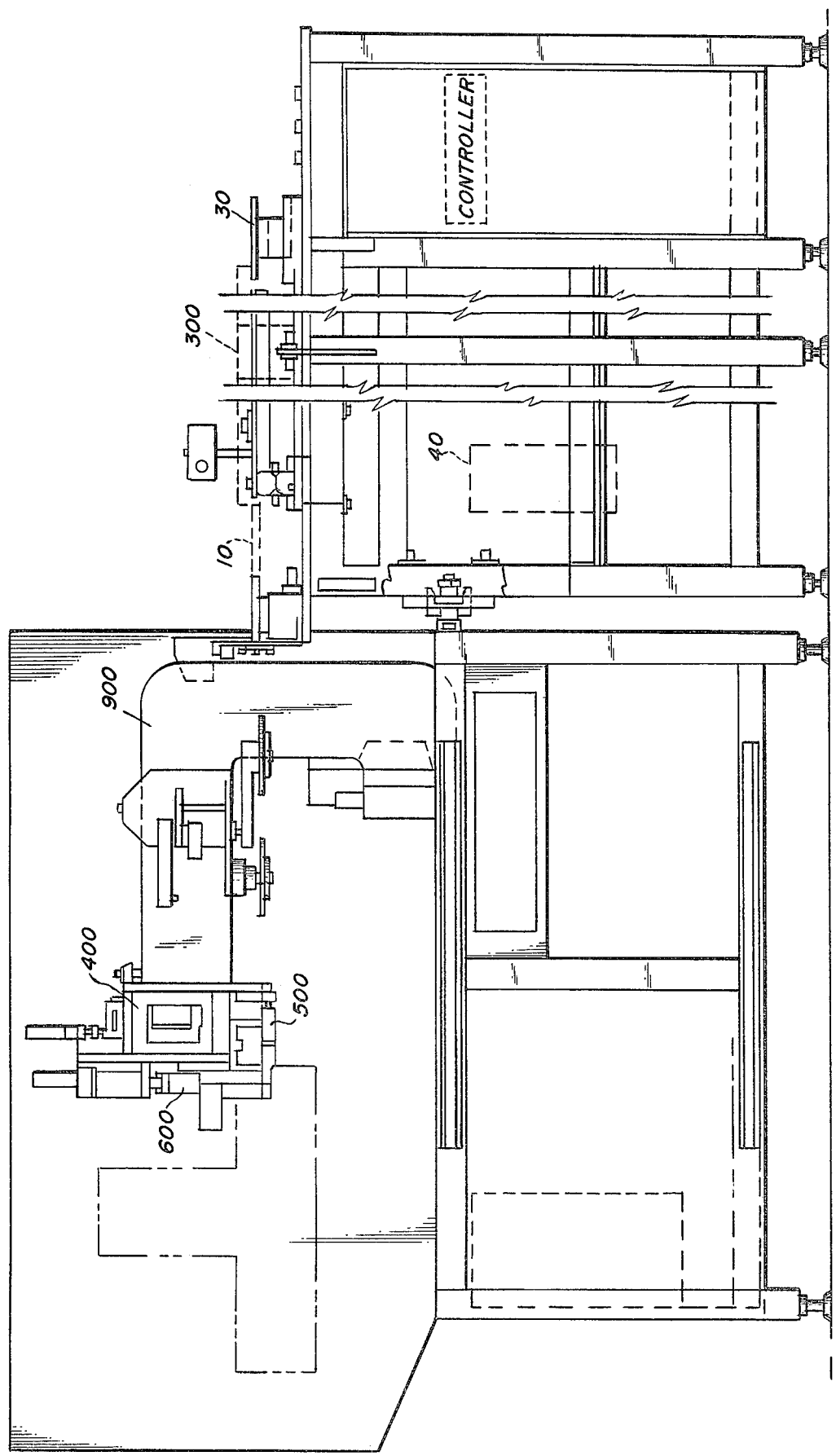
FIG. 1 is a right side elevational view of the overall apparatus.
Figure 2:
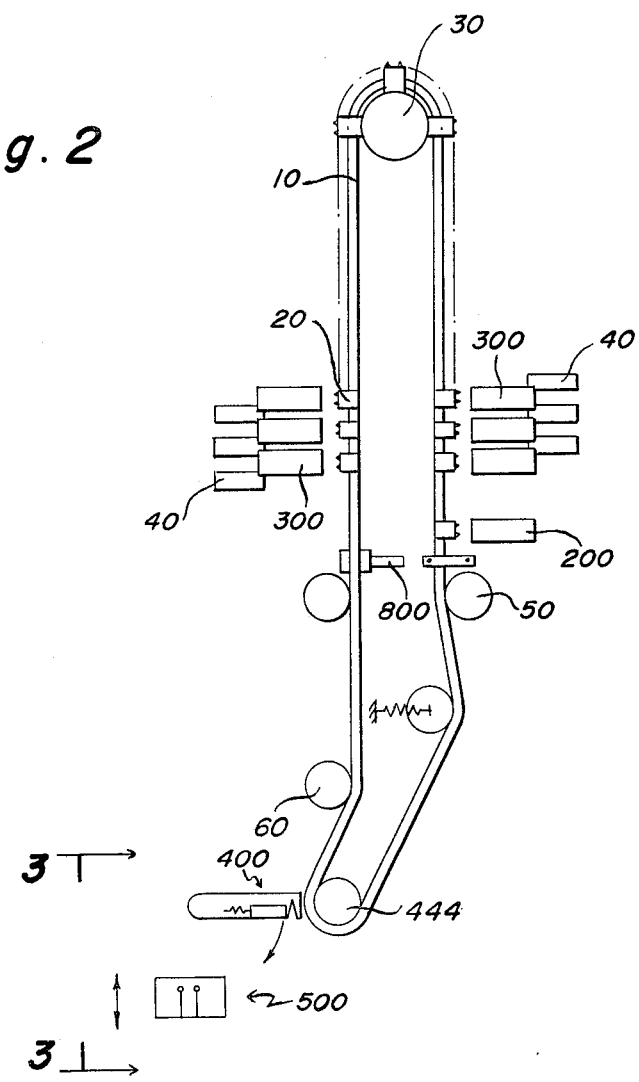
FIG. 2 is a top plan (partial schematic) view of the overall apparatus.
Figure 3:
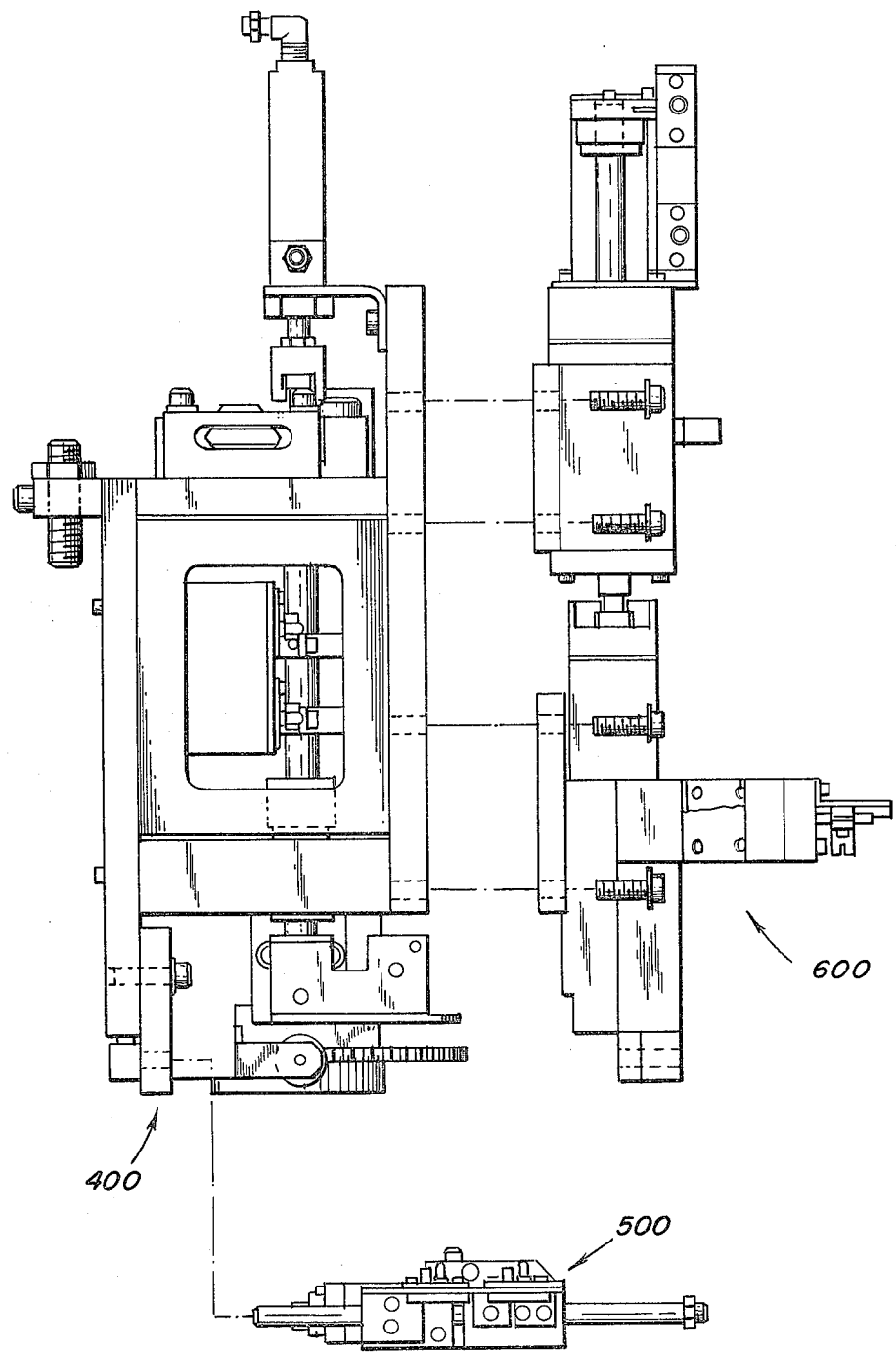
FIG. 3 is a left side elevation (partially exploded) of the rotary transfer assembly, insertion head assembly, and linear loader assembly, as viewed along arrows 3—3 of FIG. 2.

In FIG. 2, a top plan view of the general positional arrangement of the various parts of the invention may be seen. FIG. 3 shows the Rotary Transfer Assembly 400, Linear Loader 500, and Insert Assembly 600 as viewed along arrows 3—3 of FIG. 2 but with these major component parts exploded to better show their interrelationship. FIG. 1 is a side view of the entire apparatus, also to show the general positional arrangement of the various parts of the invention.

Referring to FIG. 2, an endless conveyor 10, having clip carriers 20, is driven past a plurality of Sequencer Loading Heads 300 by an incremental drive means 30. Each of these loading heads 300 may be supplied with different components from reel holder assemblies 40 or the like and are selectively fitted to load clip carriers 20 with individual components in a preferred sequence. The severed individual components, which may have tape still applied to their leads (as in FIG. 4B), are then subjected to a cutter assembly 200 (FIGS. 14–17) to trim off the taped portions of the leads. Thereafter, the clip carriers are passed over a driven rotating disc 50 (FIG. 18) having a beveled peripheral edge 51 to engage the bottoms of the leads of the components, thus raising them to be flush with the undersides of the clip carriers 20.

From the disc 50, the components are carried to the Rotary Transfer Assembly 400 for unloading from the clip carriers 20. For exact positioning of clip carriers 20 relative to rotary transfer assembly 400, conveyor 10 is provided with an adjustable idler 60.

A component, having been removed from a clip carrier 10 by Rotary Transfer Assembly 400, is transferred to a reciprocable Linear Loader 500 that loads the component into Insert Head Assembly 600. Insert Head Assembly 600 then inserts the component into a printed circuit board which is mounted on an X-Y positioning device (not shown); a clinch mechanism (not shown) clinches the leads of component to the underside of the circuit board. Any components that may remain in the clip carriers 20, as during initial start-up and alignment of the machine, are removed by a Chain Unloader 800 so that the clip carriers 20 are ready for reloading by Sequencer Loading Heads 300.

CLIP CARRIER (20)

Clip carrier 20 (FIG. 5) is attached to conveyor chain 10 by a conventional locking clip 21, and includes pivotal arm 22, spring biased into cooperative engagement with body finger 23. As seen in FIG. 5, arm 22 has tapered face 24 for engagement by a component lead, during loading of clip carrier 20 by Sequencer Loading Head 300, causing arm 22 to pivot against the bias of spring 25 for reception of the lead. Another tapered face 26 allows the captured lead to open arm 22 when being pushed out of clip carrier 10 by Chain Unloader 800.

SEQUENCER LOADING HEAD (300)

Referring to FIG. 4A electronic components are frequently supplied in dispensing reels 40. These reels 40 include a wound, cardboard substrate 41 to which the leads of the components are taped. To facilitate feeding the reel of components, the substrate and tape are perforated between individual components as at 42.

Loading heads 300 (FIGS. 6–13) are provided to intermittently feed the different taped components, sever the substrate 41 between individual components, and load the severed individual components onto separate clip carriers 20 of an endless conveyor chain 10 (with the components in the clip carriers 20 still taped to a substrate as in FIG. 4B). The sequence in which the different components are loaded onto the conveyor and arrive at the next station is determined by a programmed control for firing selected Loading Heads 300 on command.

Each Loading Head 300 includes a machined metal block 302 and reciprocable, fluid operated piston/cylinder 304 as a drive means for the indexed feeding and loading. Piston/cylinder 304 is mounted on block 302 by a support bracket 306 and threaded support rods 308; a fluid pipe 310 supplies fluid to the front of piston/cylinder 304 for the return stroke. The forward end of the piston of piston/cylinder 304 is threaded to clevis 312 which, in turn, is connected to a driver 314 by driver dowel 316. Driver 314 slides in a channel 318 in the top of block 302 for reciprocation by piston/cylinder 304, with driver dowel 316 extending downwardly through an elongate slot 320 into a generally L-shaped recess 322 in the bottom of block 302. L-shaped recess 322 is for accommodation of an indexing mechanism, as will be explained further. The limits of travel of driver 314 are defined and adjusted by two stops 323, 324 threaded into block 302 and extending into opposite ends of elongate slot 320 to abut dowel 316 which reciprocates in elongate slot 320 (best seen in FIG. 8). Pivotally and slidingly attached to the bottom end of driver dowel 316 is a link 326 to transmit the reciprocating motion to an index pawl 328 for incremental rotation of an index ratchet 330. An anti-backup pawl 332 is also provided for ratchet 330 and is attached to block 302 by an adjustable eccentric pin 334 for adjustment of loose tolerances. Ratchet 330 is attached to a rotary shaft 336, supported by bearings as at 335, which extends up through block 302 into a cut-out portion 338 in the top of block 302, as best seen in FIG. 10.

To the top end of shaft 336 is clamped a taped component feed wheel 340 having peripheral nubs 342 that engage in the perforations between components of the component supply reel. Clamping of feed wheel 340 to shaft 336 is provided by cooperating tapered rings 344, 346 held in frictional engagement between feed wheel 340 and shaft 336 by clamp washer 348 and cap screws 350.

A gate 352 is pivotally attached at 354 in order that it may be swung away from the feed wheel 340 for alignment of the taped component supply with feed wheel 340 during loading. After loading, gate 352 is swung back to a guiding position and held by a pin 356. A cutter support block 358 is adjustably attached to housing block 302 for easy positioning of cutter blade 360 next to driver channel 318. Supported on driver 314 is another cutter blade 362 that cooperates with cutter blade 360 to shear individual taped components from the incrementally advanced supply during the forward stroke of driver 314.

A particularly unique feature of the instant invention is the manner in which the individual taped components are loaded onto the conveyor chain, namely, by only one lead. This manner of loading allows the loading head 300 and the conveyor chain clip carriers to handle various two-lead, taped components having different spans between their leads. Obviously, single or multiple lead, taped components also could be handled readily.

To facilitate loading these components onto the conveyor chain by only one lead, guide fingers 364 are provided on driver 314 to engage the front lead of the taped components as they are halted in their incremental feed. Guide fingers 364 engage this front lead just prior to shearing of the individual taped component from the supply. To prevent the individual component from being thrown out of engagement with guide fingers 364 (during further forward movement of driver 314 to load the component into the conveyor clip carriers), a retainer arm 366 is adapted to engage the taped cardboard substrate 41 and retain the front lead in guide fingers 364 as driver 314 moves forward and until the front lead is loaded into the clip carrier, at which time retainer arm 366 is pivoted away from the component (to the phantom line position of FIG. 11). Referring to FIG. 13, attached to driver 314 below guide fingers 364 is a shelf 368 that provides vertical support of the individual taped component after the shearing. In addition, an angled top support plate 369 prevents the top of the component from bending back onto the top of driver 314 during the forward stroke and upon contact of the lead with the clip carrier 20 20 of the conveyor chain.

Retainer arm 366 is pivotally attached to a carrier 370, which reciprocates with driver 314 during a portion of the forward and backward stroke of driver 314; control of the pivotal action of retainer arm 366 is provided by engagement of retainer arm extension 372 with adjustable eccentric pins 374, 376 as will be explained.

Driver 314 has an orifice in which three spherical balls 378 may move transverse to the stroke direction; the sum of the diameters of the three balls 378 is slightly greater than the length of the orifice. As seen in FIG. 6, a cam plate 380 is mounted on housing block 302 to the left of driver 314, and carrier 370 is to the right. At the beginning of the forward stroke of driver 314, balls 378 are urged to their left-most position by the carrier 370. During the forward stroke, the left-most ball engages the camming surface, thus causing balls 378 to shift to the right with the right-most ball in engagement with a notch 382 in carrier 370. In this manner, carrier 370 is caused to move with driver 314 during the forward stroke.

Referring to FIG. 12, carrier 370 includes a nylon plunger 384 and spring 386, and retainer arm 366 has notches at 388. Plunger 384 holds retainer arm 366 (in the position of FIG. 6) until extension 372 engages eccentric pin 374 during the forward stroke. At this time, retainer arm 366 pivots (to the phantom line position of FIG. 11) and is held by spring biased plunger 384 until the return stroke causes extension 372 to engage eccentric pin 376 for return of retainer arm 366 (to the position of FIG. 6). A spring biased detend 390 is strategically located in housing block 302 for engagement with a second notch 392 in carrier 370 to stop the rearward motion of carrier 370 during the return stroke. Placement of detent 390 and notch 392 allows carrier 370 to urge balls 378 to the left and along the camming surface of cam plate 380 while not impeding the return stroke of driver 314; proper placement also prevents undue pressure on extension 372 by eccentric 376. Eccentric pins 374, 376 are adjustable for tolerance corrections and are locked in their adjusted positions by a clamp 394.

For an automatic indication to the machine control of the proper feed of a taped component to be sheared and loaded, a switch assembly is provided (as seen in FIG. 11). This switch assembly includes spring biased grounding plate 396, mounted on cutter support block 358, which is held in the position of FIG. 11 by the taped component supply prior to indexed advancement of a taped component to the cutting and loading position. When, for some reason, there is no supply to retard the biasing of grounding plate 396, it engages a switch contact 398 to complete the ground of a series circuit (nominally 10 volts) and to notify the control of an improper feed. If the loading head 300 receives a command from the control to be fired, but the switch assembly has been actuated by the absence of a component, the drive 30 of conveyor chain 10 will halt and the head 300 will refire a set number of times (e.g. three times) to advance the feed of a component to the load position. If a component still has not been advanced to the load position, then both the loading head 300 and the conveyor chain 10 will be halted.

In a prototype, the indexing of the feed wheel 340 was accomplished as cutter blade 362 just cleared cutter blade 360 during the return stroke of driver 314.

An individual taped component as in FIG. 4B is carried by conveyor 10 on clip carrier 20 to Cutter Assembly 200.

CUTTER ASSEMBLY (200)

As seen in FIG. 14, a cylinder 202 is mounted on slide housing 204, with piston rod 206 attached by a clevis 208 to slide 210, for reciprocation of slide 210 within a passage of housing 204. The amount of forward stroke of slide 210 is limited by an adjustable stop block 212. A bracket 213 is bolted to housing 204 and supports a die 214 and a chain guide 216 through which conveyor chain 10 is guided (for proper alignment of chain 10 with Cutter Assembly 200).

Referring to FIG. 15, a cutter blade 218 and a spring biased guide 220 are accommodated in a channel of slide 210. Cutter blade 218, pinned to slide 210 at 222, cooperates with die 214 (when slide 210 is extended) to provide for component lead shearing. Guide 220 is adapted to slide on top of cutter blade 218 against the bias of compression spring 224, as will be explained later. Vertical tang 226 of guide 220 engages the back end of cutter blade 218 (in the position of FIG. 15) to limit the forward movement of guide 220. A set screw 228 is adjustable for limiting the vertical "play" of guide 220 and cutter 218.

Functioning of the guide 220, cutter 218, and die 214 during component lead shearing is seen best in FIGS. 16A, 16B, and 17. FIG. 16A shows an individual component (as in FIG. 4B) moved into position of lead shearing (for clarity, the clip carrier is not shown). As slide 210 is extended, spring biased guide 220 preceeds cutter 218 to the component. As seen in FIG. 17, guide 220 includes a finger 229 that extends between the component leads (above the taped substrate 41) and into groove 230 in die 214. A tapered bottom 232 of finger 229 is adapted to engage the top of the taped substrate 41 for slight downward shifting of the component in the clip carrier 20 (when necessary). Further extension of slide 218 allows clamping of the leads of the component against die 214 by guide 220, under the influence of spring 224, and shearing of the taped leads by cutter 218 and die 214. By providing spring 224, different taped substrate and lead thicknesses may be accommodated.

After the taped portions of the leads of an individual component have been removed, the conveyor 10 transports the component over a driven rotary disc 50 (FIG. 18) whose outer edge is beveled as at 51 to engage the bottom surfaces of the remaining portions of the component leads, thus raising and properly positioning the component relative to clip carrier 20 for presentation to rotary transfer assembly 400.

ROTARY TRANSFER ASSEMBLY (400)

Referring to FIG. 2 a Rotary Transfer Assembly 400 is adapted to clamp and pick up a component from the clip carrier 20 of conveyor chain 10, rotate to a position above Linear Loader 500, lower and deposit the component into Linear Loader 500, raise and rotate back to the conveyor chain 10 for pick-up of another component. This Rotary Transfer Assembly is also adjustable to transfer components having different center-to-center (CTC) spacing of the leads (such as 0.200 inches or 0.300 inches CTC spacing).

The housing 402 (FIGS. 19 and 3) of Rotary Transfer Assembly 400 is adjustably attached to a C-frame support 900 (FIG. 1); housing 402 also serves as the means of support of the Insert Head Assembly 600. Insert Head Assembly housing 602 and rotary transfer housing 402 support Linear Loader 500 by Thompson shafts 504.

As seen in FIG. 19, rotary transfer housing 402 supports rotatable and vertically slideable rod 404 having center line 406. Vertical displacement piston/cylinder 408, attached to the top of housing 402 by bracket 410, has a T-nut coupling 412 with the top of rod 404. With this arrangement, rod 404 is raised and lowered by piston/cylinder 408.

Viewing the rotary transfer assembly 400 from the top, as in FIG. 20, a lever arm 414 is pinned to rod 404 at 416. Rotation piston/cylinder 418 is attached to housing 402 by spherical bearing 420 and to lever arm 414 by spherical bearing 422. Stroking of piston/cylinder 418 causes rod 404 to rotate, with spherical bearings 420, 422 allowing piston/cylinder 418 to follow the vertical motion of rod 404 when it is raised and lowered by vertical displacement piston/cylinder 408. The amount of extension of rotation piston/cylinder 418 is adjustably limited by a stop piston/cylinder 424 engaging lever arm 414 by a neoprene bumper 426. When stop piston/cylinder 424 is extended (by applying fluid pressure to the piston), rod 404 is allowed to rotate less than when piston/cylinder 424 is relaxed (and retracted by a spring 428). Fine positioning adjustment of piston/cylinder 424 is accomplished by set screws as at 430.

Refering to FIG. 26, sensing of the rotation and vertical displacement positions of rod 404 is accomplished by Hall effect digital sensors 432–435; clamped to rod 404 are holders 436, 438 for holding magnets 440–443. The functional explanation of this sensing means will follow.

Also attached to rotary transfer housing 402 is sprocket 444 for guiding conveyor chain 10 with clip carrier 20 into position for rotary transfer head 460 to grasp the leads of a component that is in the clip carrier 20. Head 460 is attached to the bottom of rod 404 and, upon grasping the leads of the component, is raised by piston/cylinder 408 to remove the component from clip carrier 20, rotated to a position above Linear Loader 500 by piston/cylinder 418, and lowered by piston/cylinder 408 to load the component into Linear Loader 500. After Linear Loader 500 has received a component, Rotary Transfer Head 460 is raised (to clear Linear Loader 500) and rotated back to sprocket 444. This process is repeated for successive components. Thus, when head 460 is in the "down" position at sprocket 444, switch 433 is closed by magnet 441; raising head 460 closes switch 432 by magnet 440 and opens switch 433; rotating head 460 (while in the "up" position) opens switch 433 and closes switch 435; lowering head 460 (while in position over linear loader 500) opens switch 435 and closes switch 434; raising head 460 opens switch 434 and closes switch 435. This cycle is repeated.

Refering to FIGS. 23 and 24, head 460 comprises a main body 462, pinned to rod 404 at 464, having a cylindrical cavity 466 for reception of piston 468 which extends through orifice 470 in cavity cover block 472. Piston 468 and cover block 472 retain a compression spring, as at 474. A pivotal clamp arm 476 is pivotally supported at 478 by body 462 and is biased away from cover block 472 by compression spring 480. A bottom plate 482, with fixed clamp arm 484, is adjustably attached to body 462 by set screws at 483 and to rod 404 at 486. Fluid admitted into port 488 extends piston 468 into engagement with pivotal arm 476 to cause a clamping action onto component leads that are located between clamp arms 476, 484 in slot 485. When fluid pressure is relieved, spring 474 returns piston 468 to relieve the clamping pressure; spring 480 still provides light frictional engagement of the leads in clamp arms 476, 484.

Refering to FIGS. 21 and 22, a nylon bearing block 490 and pivotal pressure arm 492 with roller bearing 494 aid vertical positioning of clip carrier 20 for proper presentation of a component to head 460. Arm 492 is pivotally attached at 496 (FIG. 19), with bolt 497 limiting the amount of pivot, such that roller bearing 494 is biased "up" by compression spring 498; clip carrier 20 rides between block 490 and roller 494 during presentation of a component to head 460.

The conveyor chain drive 30 is incrementally advanced so that there is a dwell in movement of clip carrier 20 during presentation of the component to head 460. The relative positioning of sprocket 444 and head 460 is such that components of different center-to-center lead spans may be accommodated. For instance, components may be used with spans of 0.200 inches or 0.300 inches, the first lead presented to slot 485 always entering slot 485 a certain amount (nominally 0.015 inches) from the back end 489 of slot 485 before clamping takes place. In this manner, the first lead is always in a fixed position relative to head 460. Stop piston/cylinder 424 (which limits the amount of rotation of head 460) is used to vary the positioning of head 460 such that the component leads straddle the centerline 544 of Linear Loader 500.

LINEAR LOADER (500)

The Linear Loader of FIGS. 27–30 includes a carriage 502 which rides on Thompson shafts 504 and is reciprocated on these shafts 504 between a "receive" position and a "discharge" position by piston/cylinder 506. In the "receive" position, linear loader 500 receives a component (by the leads) from rotary transfer head 460; in the "discharge" position, Linear Loader 500 loads the component (again, by the leads) into Insert Head 600. Piston/cylinder 506 is clamped onto Thompson shafts 504 by integral clamping wings 508 which are tightened down by hex screws or the like. An angled digital sensor support bracket 510 is bolted to one side of piston/cylinder 506 at 512 and supports two spaced Hall effect switch digital sensors 514, 515. Another angled support bracket 516 has two spaced magnets 518, 519 clamped thereto and is bolted onto carriage 502 at 520 such that bracket 516 passes near to bracket 510 during the reciprocation of carriage 502. With this arrangement, magnet 518 is opposed to sensor 515 when carriage 502 is in the "receive" position, and magnet 519 is opposed to sensor 514 when carriage 502 is in the "discharge" position.

Piston rod 522, attached to the piston of piston/cylinder 506 is reduced in diameter at 524 (FIG. 29) to form an abutment for one end of a compression spring 526, the other end of spring 526 abutting the end 528 of bore 530 in carriage 502. The purpose of spring 526 will become clear from the following description. Bearing 532 keeps the reduced portion 524 of piston rod 522 centered in bore 530. As seen in FIG. 28, a generally U-shaped bracket 534 is bolted to the end of reduced portion 524 at 535 and has rods 536 extending across the "U" of the bracket.

For extension of piston rod 522, 60 pounds and 80 pounds of air are applied to respective ports 538, 539. For retraction, 60 pounds of air is applied to only port 538. During extension, due to the differences in the air pressure admitted and the differences in face areas on each side of the piston, a low level net force for extension of rod 522 is provided. As this extension begins, a regulator (not shown) in port 538 maintains 60 pounds of air pressure on the rod side of piston/cylinder 506 throughout the forward stroke. When sensor 514 is actuated by magnet 519 (near to, but not at full stroke of the piston) and at the point of travel of carriage 502 at which bumpers 540 contact adjustable screws 542 (mounted on insert head housing 602 as seen in FIG. 27), the 60 pound air pressure is completely evacuated. Eighty pounds of air pressure (still on the piston side) then causes full stroke and compression of spring 526. Thus, with the regulated evacuation of 60 pounds of air pressure from the rod side of piston/cylinder 506, the full brunt of the forward stroke (acting against the inertia of carriage 502) does not sufficiently compress spring 526 to defeat its purpose of spacing the carriage 502 relative to rod 522 until screws 542 have halted forward travel of carriage 502.

Each side of the centerline 544 of carriage 502, and any attachment thereto, is a mirror image of the other side of the center line 544 (except for the already described magnet support bracket 516 added to one side); therefore, a description of one side of the centerline 544 will suffice.

The top face of carriage 502 is channeled to receive laterally reciprocable slide 546. Slide 546 has a slot 548 and arms 550, 551 (FIG. 28) extending upwardly above the top face of carriage 502. Straddling slide 546 and bolted to carriage 502 as at 552 is a slide retaining plate 554.

Attached by machine screws to arm 550 of slide 546 are clamp jaw 556 and guide jaw 558. Clamp jaw 556 has a reduced thickness to afford slight lateral flexure away from centerline 544. Guide jaw 558 is cut away along the length thereof to provide a gap between it and clamp jaw 556 in which a pusher plate 560 (best seen in FIGS. 29 and 32) reciprocates parallel to centerline 544. Pusher plate 560 is slidingly supported by rods 536 and has a step 561 notched out of one corner of the plate. Guide jaw 558 and clamp jaw 556 have cooperating depressions 563 (as if a solid cone was cut out of their top surfaces with guide jaw 558 and clamp jaw 556 side-by-side) to guide the reception of a component lead into step 561 of pusher plate 560 when the carriage is in the "receive" position.

Carriage 502 has a lateral adjustment for accommodating components having different lead spacings (i.e., 0.200" or 0.300"). To facilitate this adjustment (again, explaining only one side of carriage 502), cylinder 564 has been bored in the body of carriage 502 for reception of piston 566. Piston rod 568 extends out of cylinder 564 and is attached by a machine screw to vertical plate 570 which, in turn, is bolted to arm 551 of slide 546. In this manner, stroking of piston 566 causes reciprocation of slide 546; the reciprocation of slide 546 is limited by post 572 which is press-fit into the channeled face of carriage 502 and extends upwardly into sliding engagement with slot 548. The limits of travel of slide 546 are determined by the length of slot 548 (nominally, allowing 0.050 inches of travel of slide 546 for a 0.100 inch change). By controlled stroking of piston rod 568, guide jaw 558 and clamp jaw 556 are adjustable toward or away from centerline 544 with consequent lateral sliding of pusher plate 560 along rods 536 for compensation of different center-to-center component lead spans.

In operation, with carriage 502 in the "receive" position and adjusted for a particular lead spacing, Rotary Transfer Assembly 600 lowers a component to allow the leads to engage depressions 563 and be guided into frictional engagement between guide jaw 558 and clamp jaw 556 and onto step 561, at which time Rotary Transfer Assembly 600 unclamps, raises up, and pivots away (this position is best seen in FIGS. 31 and 32). Forward stroking of piston/cylinder 506 drives loaded pusher plate 560 to the "discharge" position (at Insert Head Assembly 600). Until carriage bumpers 540 engage screws 542 to halt forward movement of carriage 502, the leads are still held frictionally between guide jaws 558 and clamp jaws 560; upon this engagement of bumpers 540 and screws 542, carriage 502 is halted and pushers 560 push the leads of the component into frictional engagement with gripper assembly 670 (of Insert Head Assembly 600, as described in the next section). The carriage 502 is then returned to the "receive" position, as described above.

For cushioning the return of carriage 502 to the "receive" position, compression springs 574 (encompassing Thompson shafts 504) are interposed between carriage 502 and clamping wings 508. A set screw and lock nut arrangement 543 limits the return of carriage 502 during the back stroke of piston/cylinder 506.

Upon being loaded into Insert Head Assembly 600, the component is ready to be positioned and inserted into the printed circuit board.

INSERT HEAD ASSEMBLY (600)

Referring to FIGS. 34 and 35, insert head assembly 600 includes fixed housing 602 having three (3) laterally reciprocable guide rods 604 spaced 60° apart around the periphery of a rotatable, reciprocable guide tube 606 (as seen in FIG. 36) for selective engagement of guide rods 604 into respective guide grooves of guide tube 606. Each guide rod 604 is rotatable upon its own longitudinal axis, with a spring 610 for extension and a pneumatic piston/cylinder 612 for retraction. Bearings 614 are provided for the rotational support of guide rod 604 and are spaced apart along the axis of guide rod 604 by spring 616. Each guide rod 604 is loosely, yet fixedly, engaged on the outside end to a piston 613 of the guide rod assembly piston/cylinder 612. By pneumatics, this piston 613 retracts guide rod 604 against the positive action of spring 610 when air is applied; when no air is applied, the piston 613 is extended by spring 610.

Referring to FIG. 35, the outer face of guide tube 606 has three guide grooves 620, 621, and 622. Center guide groove 621 is arranged parallel to the axis 624 of the guide tube 606 such that tube 606 may only displace vertically with the corresponding guide rod 604 engaged in this groove 621; the other two guide grooves 620, 622 are oppositely helixed such that the guide tube will rotate a total of ±90° during a complete reciprocation between the "up" and "down" positions.

Complete reciprocation of guide tube 606 is accomplished by a "vertical piston/cylinder" 626 mounted on the same support 628 as housing 602. To the upper end of guide tube 606 is secured a thrust block 630 by machine screws such as 632. This thrust block 630 receives and retains the lower end of a rod 634 (to which is attached the piston of "vertical piston/cylinder" 626) and is tooled to a tolerance that allows it to rotate about the longitudinal axis 624 during reciprocation of rod 634.

Attached to the top end of rod 634 is a threaded clamp collar 638. By adjusting threaded clamp collar 638 longitudinally on rod 634, the length of stroke of the "vertical piston/cylinder" 626 may be set.

Mounted on the upper end of "vertical piston/cylinder" 626 is a "partial retract piston/cylinder" 640, the piston of which slideably encompasses the upper end of rod 634. The upper end 642 of this piston extends out of its cylinder such that a neoprene bumper 644 engages it when rod 634 is in the extreme "down" position. The working surface area of the piston of "partial retract piston/cylinder" 640 is larger than that of the piston of "vertical piston/cylinder" 626. With these different surface areas, rod 634 (when in the extreme "down" position under the action of "vertical piston/cylinder" 626) may be partially retracted "up" (nominally one quarter inch) by the piston of "partial retract piston/cylinder" 640 in engagement with bumper 644, while applying the same air pressure to both piston/cylinders 626 and 640.

Referring to FIGS. 33 and 34, two Hall effect switches 646, 647 are mounted along the line of travel of rod 634; a permanent magnet 648 is mounted upon the extreme upper end of reciprocable rod 634. These Hall effect switches 646, 647 are common in the industry and are manufactured by SPRAGUE as types UGN-3220S and UGS-3220S. Switches 646, 647 are used to indicate the respective extreme "up" and "down" positions of rod 634.

The upper end of rotatable, reciprocable guide tube 606 has an enlarged recess 650 to form the cylinder of a drive piston/cylinder of which the piston 652 includes hollow piston rod 654 telescoping inside guide tube 606. The lower end of hollow piston rod 654 has a nub 656 for a purpose yet to be explained. Hollow piston rod 654 is extended downwardly relative to guide tube 606 when air is supplied to extension air inlet 635 and is retracted upwardly relative to guide tube 606 when air is supplied to the bottom of piston 652 at retraction air inlet 636. Access of air from inlet 635 to the top of piston 652 is via bore 619 of FIG. 34. Referring to FIG. 35, access of air to the bottom of piston 652 from retraction air inlet 636 is via plate hole 637, bore 617 in the body of guide tube 606 (parallel to axis 624), and cross-bore 618 in the body of guide tube 606 (perpendicular to axis 624). A plug (not shown) seals the intersection of cross-bore 618 and the outer surface of guide tube 606.

An insert plunger 658 is telescopingly received in hollow piston rod 654 and is slotted at 660. A pin 662 has a force fit connection with piston rod 654 and is adapted for sliding engagement with slot 660 of plunger 658 to provide limits for telescoping of plunger 658. Abutting the upper end of plunger 658 is the lower end of compression spring 664, the upper end of which abuts a plug 666. In this manner, with nothing else affecting plunger 658, spring 664 biases plunger 658 to an extended position.

Guide tube 606 includes pivot pins 668 (perpendicular to longitudinal axis 624) for pivotally supporting a gripper assembly 670. Referring to FIGS. 34, 35, 39, 40, gripper assembly 670 includes a U-shaped trough 672 with the axis 673 of trough 672 angled (nominally 10°) away from longitudinal axis 624. The sides of trough 672 have projecting tangs 674 and raised fins 676 (for a purpose yet to be explained). Extending downwardly and angling toward longitudinal axis 624 is guide jaw 678. Pins 680 and 682 act as supports and lateral guides for leaf jaws 684 on each side of guide jaw 678. Bore 686 in guide jaw 678 is for reception of a compression spring 688 that biases leaf jaws 684 away from guide jaw 678 to the "open" position. Extending through guide tube 606 is a rotatably adjustable eccentric rod 690 adapted to limit pivoting of guide jaw 678 toward longitudinal axis 624. A tension spring 692 is attached at one end to a pin 694 in the body of guide assembly 678 and at the other end to eccentric rod 690, thus biasing guide jaw 678 away from longitudinal axis 624. Dowels 695 are attached to both sides of guide tube 606 and extend into a pair of clamping bars 698 to loosely retain these clamping bars 698 (perpendicular to longitudinal axis 624) to prevent them from falling out of guide tube 606. Set screws 700 (for adjustment of clamping) are threaded into clamping bars 698 and extend inwardly into engagement with the outside surfaces of leaf jaws 684. Each bar 698 (FIG. 41) has bevelled portions 704 and a flat portion 706, for purposes yet to be explained.

A cam plate 708 (FIG. 42) is adapted to slide up and down under the influence of piston rod 654 and has flats 710 and a machined channel 712 extending substantially the entire length of plate 708. At the upper end of cam plate 708 on each side of channel 712, are two inclined cam surfaces 714 at the lower end are notches 716 forming ears 718 and ear cam surfaces 720. Channel 712 receives nub 656 of piston rod 654 for sliding engagement until nub 656 abuts the upper or lower end of channel 712.

With the gripper in the position of FIG. 34, hollow piston rod 654 is in the raised position and nub 656 prevents cam plate 708 from sliding downwardly. The fins 676 of guide jaw bear against flats 710 of cam plate 708 under the bias of tension spring 692. Flat portions 706 of clamping bars 698 are engaged with ears 718 of cam plate 708 to clamp the leaf jaws 684 closed.

When hollow piston rod 654 is extended downwardly, nub 656 slides in channel 712 until it engages the lower end of channel 712. Continued downward movement of rod 654 forces cam plate 708 downward so that fins 676 of the gripper ride down incline cams 714 (allowing guide jaw 678 to pivot away from longitudinal axis 624), and clamp bars 698 ride into notches 716 under the influence of compression spring 664 (to allow opening leaf jaws 684 by spring 688).

Retraction of hollow piston rod 654 causes nub 656 to slide upwardly until it abuts the upper end of channel 712. Continued upward movement of rod 654 forces cam plate 708 upward so that fins 676 of the gripper ride up incline cams 714 (allowing guide jaw 678 to pivot toward longitudinal axis 624); ear cams 720 ride on bevels 704 of clamp bars 698 until ears 718 engage flat portions 706 (to close leaf jaws 684).

Referring to FIG. 43 for the jaw configuration of gripper assembly 670, it can be seen that guide jaw 678 has notches 722 and tapered portions 724; leaf jaws 684 each have an inset surface 726 angling out to an obtuse corner 728, and then tapered back again at 730. When leaf jaws 684 and guide jaw 678 are arranged side-by-side as shown in FIG. 43, each obtuse corner 728 extends slightly into each notch 722; notches 722 and insets 726 form a slot in which components leads can be held by an interference fit. Tapers 730 allow easier sliding of leads into the slots and obtuse corners 728 retain the leads in the slots. In the unclamped position of the jaws, the clearances of obtuse corners 728 are slightly less than the outside diameter of each lead, such that leaf jaws 684 are flexed outwardly by engagement of the leads with obtuse corners 730 during their reception. When the leaf jaws 684 are clamped, the leads are securely held in notches 722 by inset surfaces 726.

As seen in FIG. 37, engagement or disengagement of a guide rod (604) in one of the guide grooves (620, 621, 622) is sensed for control purposes. To facilitate this sensing, piston (613) has an extension 732 with a permanent magnet 734 clamped to it; magnet 734 cooperates with Hall Effect digital sensor 736 to indicate the extended or retracted position of guide rod (604).

CHAIN UNLOADER (800)

FIG. 44 shows Chain Unloader 800 comprising a fairly flexible metal ejector 802 attached to reciprocation piston/cylinder 804. An angled mounting bracket 806 mounts the device so that ejector 802 is at an angle to clip carrier 20. Preferably, bracket 806 is adjusted so that ejector 802 engages the top face of clip carrier 20 just prior to engagement with the component lead (as seen in FIG. 45). With this arrangement, extension of ejector 802 pushes the component out of clip carrier 20. A bin (not shown) is provided to catch the unloaded components.

It will thus be seen that the objects set forth above, among those made apparent from the preceeding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described what is claimed as new and desired to be secured as Letters Patent is:

1. An apparatus for cyclical transfer of radial lead components from a receive position laterally to a discharge position, said apparatus comprising:
    pusher means for engaging a component;
    pusher support means for supporting said pusher for forward and return lateral travel parallel to a centerline;
    clamping means attached to a laterally movable carriage for clamping said component and moving with said pusher during a portion of said foward and return travel of said pusher;
    stop means for halting forward travel of said carriage while said pusher continues forward to push said component out of clamping engagement with said clamping means to said discharge position; and
    reciprocator means for providing different forward and return travel speeds to said pusher support means.

2. An apparatus for cyclical transfer of radial lead components from a receive position laterally to a discharge position, said apparatus comprising:
    clamping means for receiving and clamping leads of a component, said clamping means attached to a movable carriage for forward and return lateral movement, said clamping means comprising at least first and second spaced lead clamps adjustable substantially transverse to a centerline of said lateral movement such that said clamps are adjustable for receiving variously spaced leads of said component;

pusher means for engaging and pushing said leads of said component clamped in said clamping means out of said clamping means to said discharge position, said pusher means comprising at least first and second lead engageable pusher plates respectively adjustable with said clamps relative to said centerline; and pusher support means for supporting and moving said pusher means relative to said clamping means during at least a portion of said lateral movement.

3. An apparatus as in claim 2, wherein said apparatus further comprises:

lead spacing compensation means for adjusting the spacing between said spaced lead clamps to compensate for different center-to-center lead spacing of said radial lead components.

4. An apparatus as in claim 2, wherein each of said clamps include a rigid jaw and a flexible jaw spaced apart less than the diameter of a lead for frictional clamping engagement of said lead, and each of said pusher plates is slideable between said clamp jaw and said guide jaw to disengage said lead from said clamping engagement.

5. An apparatus for cyclical transfer of radial lead components from a receive position to a discharge position, said apparatus comprising:

clamping means for receiving and clamping leads of component fed thereto at said receive position from one direction and displacing said component in another direction substantially perpendicular to said one direction;

pusher means for pushing said component in said other direction relative to said clamping means to unclamp said leads at said discharge position, said pusher means comprising a step substantially perpendicular to said one direction to engage the ends of said clamped leads and limit the feeding of said component into said clamping means and a riser substantially perpendicular to said step to engage said leads along at least a portion of their lengths and displace said leads from said clamping means at said discharge position;

means for moving said clamping means to displace said components; and means for moving said pusher means relative to said clamping means to unclamp said leads.

6. An apparatus as in claim 5, and further comprising:

means for adjusting said clamping means and said pusher means such that said apparatus is adjustable for different component lead spacings.

* * * * *